US010135391B2

(12) United States Patent
Shirotori et al.

(10) Patent No.: US 10,135,391 B2
(45) Date of Patent: *Nov. 20, 2018

(54) OSCILLATION CIRCUIT, ELECTRONIC APPARATUS, AND MOVING OBJECT

(71) Applicant: Seiko Epson Corporation, Tokyo (JP)

(72) Inventors: Toru Shirotori, Minamiminowa (JP); Hisashi Yamaguchi, Fujimi (JP); Masaki Wakamori, Shiojiri (JP); Toshiya Usuda, Ina (JP); Masayuki Kamiyama, Chino (JP); Sho Matsuzaki, Ina (JP); Hiroshi Kiya, Suwa (JP); Tsuyoshi Yoneyama, Chino (JP)

(73) Assignee: Seiko Epson Corporation (JP)

( * ) Notice: Subject to any disclaimer, the term of this patent is extended or adjusted under 35 U.S.C. 154(b) by 94 days.

This patent is subject to a terminal disclaimer.

(21) Appl. No.: 15/245,670

(22) Filed: Aug. 24, 2016

(65) Prior Publication Data
US 2017/0063305 A1    Mar. 2, 2017

(30) Foreign Application Priority Data

Aug. 28, 2015   (JP) ................................ 2015-168792

(51) Int. Cl.
| | |
|---|---|
| *H03L 1/04* | (2006.01) |
| *H03B 5/32* | (2006.01) |
| *H03L 1/02* | (2006.01) |
| *H03B 5/04* | (2006.01) |
| *H03B 5/12* | (2006.01) |

(52) U.S. Cl.
CPC ................. *H03B 5/32* (2013.01); *H03B 5/04* (2013.01); *H03B 5/1234* (2013.01); *H03B 5/1265* (2013.01); *H03L 1/02* (2013.01); *H03L 1/026* (2013.01); *H03L 1/04* (2013.01)

(58) Field of Classification Search
CPC .. H03L 1/02; H03L 1/04; H03L 1/026; H03B 5/04; H03B 5/1265; H03B 5/1234
USPC ........................ 331/176, 158, 116 FE, 177 V
See application file for complete search history.

(56) References Cited

U.S. PATENT DOCUMENTS

| | | | |
|---|---|---|---|
| 4,737,944 A | 4/1988 | Inoue et al. | |
| 7,371,005 B1 | 5/2008 | Ahuja et al. | |
| 2009/0115542 A1* | 5/2009 | Nakamura | ............... H03B 5/04 331/176 |
| 2013/0285640 A1* | 10/2013 | Yamada | ................... H03L 1/02 324/76.11 |

(Continued)

FOREIGN PATENT DOCUMENTS

| | | |
|---|---|---|
| JP | 58-041379 A | 3/1983 |
| JP | 61-032604 A | 2/1986 |

(Continued)

*Primary Examiner* — Arnold Kinkead
(74) *Attorney, Agent, or Firm* — Harness, Dickey & Pierce, P.L.C.

(57) ABSTRACT

An oscillation circuit includes an oscillating circuit adapted to oscillate a resonator element, a capacitance circuit connected to the oscillating circuit, and capable of correcting an oscillation frequency of the oscillating circuit, a logic circuit to which a signal output from the oscillating circuit is input, and which is capable of correcting a frequency of the signal, and a control circuit adapted to control an operation of the capacitance circuit and an operation of the logic circuit.

14 Claims, 12 Drawing Sheets

(56) References Cited

U.S. PATENT DOCUMENTS

2014/0247095 A1   9/2014   Edwards et al.

FOREIGN PATENT DOCUMENTS

| JP | 62-237388 A | 10/1987 |
| JP | 07-159553 A | 6/1995 |
| JP | 2002-228778 A | 8/2002 |
| JP | 2004-072289 A | 3/2004 |

* cited by examiner

OPERATION CONTROL DATA

| D1 | D0 |
|---|---|
| CONTROL BIT OF LOGIC CIRCUIT | CONTROL BIT OF CAPACITANCE CIRCUIT |

D0=0: NO CORRECTION
D0=1: CORRECTION OF FREQUENCY-TEMPERATURE CHARACTERISTIC

D1=0: NO CORRECTION
D1=1: AGING CORRECTION

FIG. 2

OPERATION CONTROL DATA

| D2 | D1 | D0 |
|---|---|---|
| CONTROL BIT OF LOGIC CIRCUIT | | CONTROL BIT OF CAPACITANCE CIRCUIT |

D0=0 : NO CORRECTION
D0=1 : CORRECTION OF FREQUENCY-TEMPERATURE CHARACTERISTIC (D2,D1)=(0,0) : NO CORRECTION
(D2,D1)=(0,1) : AGING CORRECTION
(D2,D1)=(1,0) : CORRECTION OF FREQUENCY-TEMPERATURE CHARACTERISTIC
(D2,D1)=(1,1) : AGING CORRECTION AND CORRECTION OF
               FREQUENCY-TEMPERATURE CHARACTERISTIC

OPERATION CONTROL DATA

| D4 | D3 | D2 | D1 | D0 |
|---|---|---|---|---|
| CONTROL BIT OF LOGIC CIRCUIT ||| CONTROL BIT OF CAPACITANCE CIRCUIT ||

(D1,D0)=(0,0): NO CORRECTION
(D1,D0)=(0,1): CORRECTION OF FREQUENCY-TEMPERATURE CHARACTERISTIC IN PREDETERMINED TEMPERATURE RANGE
(D1,D0)=(1,0): CORRECTION OF FREQUENCY-TEMPERATURE CHARACTERISTIC OUTSIDE PREDETERMINED TEMPERATURE RANGE
(D1,D0)=(1,1): CORRECTION OF FREQUENCY-TEMPERATURE CHARACTERISTIC IN ENTIRE TEMPERATURE RANGE (D4,D3,D2)=(0,0,0): NO CORRECTION
(D4,D3,D2)=(0,0,1): AGING CORRECTION
(D4,D3,D2)=(0,1,0): CORRECTION OF FREQUENCY-TEMPERATURE CHARACTERISTIC ONLY IN PREDETERMINED TEMPERATURE RANGE
(D4,D3,D2)=(0,1,1): AGING CORRECTION AND CORRECTION OF FREQUENCY-TEMPERATURE CHARACTERISTIC ONLY IN PREDETERMINED TEMPERATURE RANGE
(D4,D3,D2)=(1,0,0): CORRECTION OF FREQUENCY-TEMPERATURE CHARACTERISTIC ONLY OUTSIDE PREDETERMINED TEMPERATURE RANGE
(D4,D3,D2)=(1,0,1): AGING CORRECTION AND CORRECTION OF FREQUENCY-TEMPERATURE CHARACTERISTIC ONLY OUTSIDE PREDETERMINED TEMPERATURE RANGE
(D4,D3,D2)=(1,1,0): CORRECTION OF FREQUENCY-TEMPERATURE CHARACTERISTIC IN ENTIRE TEMPERATURE RANGE
(D4,D3,D2)=(1,1,1): AGING CORRECTION AND CORRECTION OF FREQUENCY-TEMPERATURE CHARACTERISTIC IN ENTIRE TEMPERATURE RANGE

FIG. 9

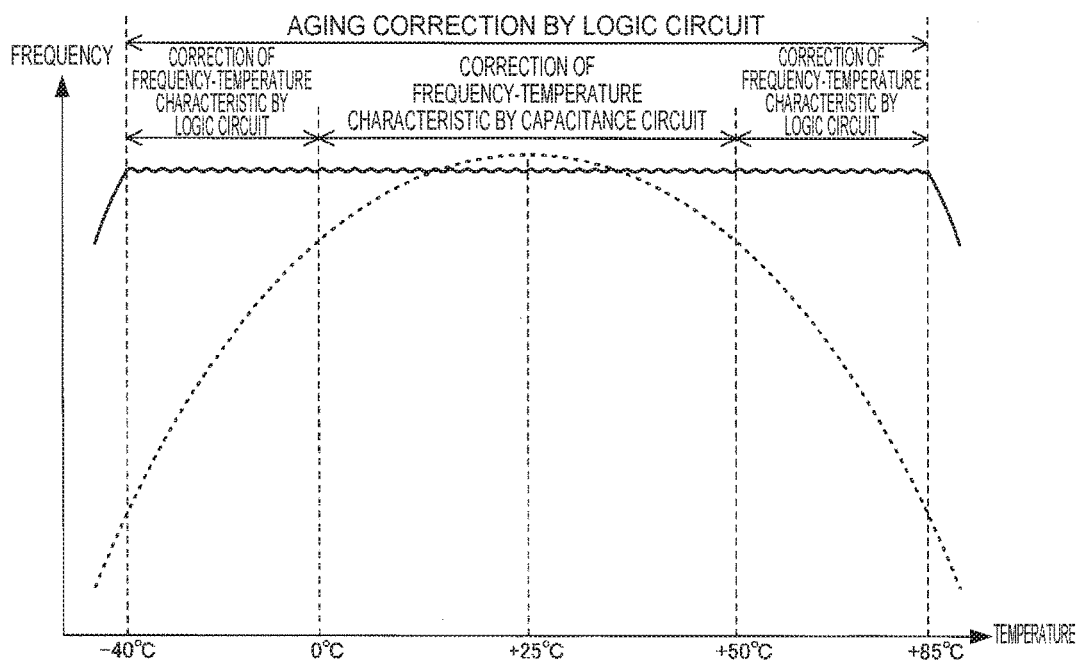

FIG. 10

OSCILLATION CIRCUIT, ELECTRONIC APPARATUS, AND MOVING OBJECT

BACKGROUND

1. Technical Field

The present invention relates to an oscillation circuit, an electronic apparatus, and a moving object.

2. Related Art

In JP-A-2004-72289 (Document 1), there is disclosed a frequency adjustment circuit capable of adjusting the oscillation frequency by performing an adjustment of a capacitance value of a variable capacitance circuit and an adjustment of a division number of a divider circuit in an oscillation circuit including the variable capacitance circuit and the divider circuit. The variable capacitance circuit is used for correction of a frequency variation caused by a characteristic variation of the oscillation circuit or a characteristic variation of a resonator, and the divider circuit is used for temperature compensation of the frequency of the resonator.

However, in the frequency adjustment circuit described in Document 1, the correction method of the oscillation frequency cannot be selected. Specifically, even in the case in which it is wanted to compensate only the frequency-temperature characteristic of the resonator, or to perform the correction of the frequency variation caused by the characteristic variation of the oscillation circuit or the resonator, since an unnecessary frequency correction circuit is connected to the oscillation circuit, there is a possibility that the power consumption increases. Further, since the correction method of the oscillation frequency cannot be selected, there is a possibility that the application is limited.

SUMMARY

An advantage of some aspects of the invention is to provide an oscillation circuit capable of selecting the correction method of the oscillation frequency depending on the intended use. Another advantage of some aspects of the invention is to provide an electronic apparatus and a moving object using the oscillation circuit.

The invention can be implemented as the following aspects or application examples.

Application Example 1

An oscillation circuit according to this application example includes an oscillating circuit adapted to oscillate a resonator element, a capacitance circuit connected to the oscillating circuit, and capable of correcting an oscillation frequency of the oscillating circuit, a logic circuit to which a signal output from the oscillating circuit is input, and which is capable of correcting a frequency of the signal, and a control circuit adapted to control an operation of the capacitance circuit and an operation of the logic circuit.

The circuit including the oscillating circuit and the resonator element can be a variety of types of oscillation circuit such as a pierce oscillator circuit, an inverter type oscillation circuit, a Colpitts oscillator circuit, or a Hartley oscillator circuit.

According to the oscillation circuit related to this application example, since the control circuit for controlling the operations of the capacitance circuit and the logic circuit is provided, by the control circuit controlling both of the capacitance circuit and the logic circuit to correct the frequency, the high frequency accuracy can be realized. Further, for example, by the control circuit controlling both of the capacitance circuit and the logic circuit not to correct the frequency, low power consumption can be realized. Further, for example, by the control circuit performing the control so that only either one of the capacitance circuit and the logic circuit corrects the frequency, both of the frequency accuracy and the low power consumption can be achieved as much as possible. Therefore, according to the oscillation circuit related to this application example, the correction method of the oscillation frequency can be selected depending on the intended use.

Application Example 2

In the oscillation circuit according to the application example described above, the capacitance circuit may be capable of correcting a frequency-temperature characteristic of the resonator element, and the logic circuit may be capable of correcting a frequency variation other than the frequency-temperature characteristic of the resonator element.

According to the oscillation circuit related to this application example, for example, by the control circuit controlling the capacitance circuit to correct the frequency-temperature characteristic of the resonator element, high frequency accuracy can be realized irrespective of the temperature. Further, by the control circuit controlling the logic circuit to correct the frequency variation other than the frequency-temperature characteristic of the resonator element, higher frequency accuracy can be realized.

Application Example 3

In the oscillation circuit according to the application example described above, the frequency variation other than the frequency-temperature characteristic of the resonator element may be a temporal frequency variation of the resonator element.

According to the oscillation circuit related to this application example, for example, by the control circuit controlling the logic circuit to correct the frequency with time of the resonator element, constant frequency accuracy can be maintained for a long period of time.

Application Example 4

In the oscillation circuit according to the application example described above, the logic circuit may further be capable of correcting the frequency-temperature characteristic of the resonator element, and the control circuit may control an operation of the logic circuit correcting the frequency variation other than the frequency-temperature characteristic of the resonator element and an operation of the logic circuit correcting the frequency-temperature characteristic of the resonator element.

According to the oscillation circuit related to this application example, for example, by the control circuit controlling both of the capacitance circuit and the logic circuit to correct the frequency-temperature characteristic of the resonator element, higher frequency accuracy can be realized. Further, for example, by the control circuit controlling both of the capacitance circuit and the logic circuit to correct the frequency-temperature characteristic of the resonator element, and at the same time controlling the logic circuit to correct the other frequency variation, higher frequency accuracy can be realized.

Application Example 5

In the oscillation circuit according to the application example described above, the control circuit may control the operation of the capacitance circuit correcting the frequency-temperature characteristic of the resonator element separately between an inside of a predetermined temperature range and an outside of the predetermined temperature range, and control the operation of the logic circuit correcting the frequency-temperature characteristic of the resonator element separately between the inside of the predetermined temperature range and the outside of the predetermined temperature range.

According to the oscillation circuit related to this application example, for example, by the control circuit controlling only the capacitance circuit to correct the frequency-temperature characteristic of the resonator element in the predetermined temperature range, and controlling only the logic circuit to correct the frequency-temperature characteristic of the resonator element outside the predetermined temperature range, both of the frequency accuracy and the low power consumption can be achieved as much as possible. Further, for example, by the control circuit controlling both of the capacitance circuit and the logic circuit to correct the frequency-temperature characteristic of the resonator element in the predetermined temperature range, and at the same time controlling only the logic circuit to correct the frequency-temperature characteristic of the resonator element outside the predetermined temperature range, higher frequency accuracy can be realized in the predetermined temperature range, and the low power consumption can be maintained outside the predetermined temperature range.

Application Example 6

The oscillation circuit according to the application example described above may further include a storage section storing time information, and the control circuit may output a correction signal based on the time information to the logic circuit.

The time information is, for example, the information related to the reference time (zero point) for calculating the elapsed time, and it is possible for the control circuit to output a correction signal for correcting the frequency variation corresponding to the elapsed time based on the time information.

According to the oscillation circuit related to this application example, for example, since the control circuit can make the logic circuit appropriately correct the frequency variation corresponding to the elapsed time based on the time information, the frequency accuracy can be maintained even after the time has elapsed.

Application Example 7

The oscillation circuit according to the application example described above may further include a storage section storing the time information and information for calculating a temporal frequency variation the resonator element has, and the control circuit may output a correction signal based on the time information and the information for calculating the temporal frequency variation to the logic circuit.

The time information is, for example, the information related to the reference time (zero point) for calculating the elapsed time, and it is possible for the control circuit to output a correction signal for correcting the temporal frequency variation.

According to the oscillation circuit related to this application example, for example, by the control circuit controlling the logic circuit to accurately correct the temporal frequency variation, high frequency accuracy can be maintained after the time has elapsed.

Application Example 8

An electronic apparatus according to this application example includes any one of the oscillation circuits described above.

Application Example 9

A moving object according to this application example includes any one of the oscillation circuits described above.

According to these application examples, since there is used the oscillation circuit capable of selecting the correction method of the oscillation frequency depending on the intended use, for example, the electronic apparatus and the moving object high in reliability can also be realized.

BRIEF DESCRIPTION OF THE DRAWINGS

The invention will be described with reference to the accompanying drawings, wherein like numbers reference like elements.

FIG. 2 is a diagram showing an example of operation control data in the first embodiment.

FIG. 9 is a diagram showing an example of operation control data in the third embodiment.

FIG. 10 is a diagram showing an example of a correction operation and the frequency-temperature characteristic of an output signal of a logic circuit in the third embodiment.

DESCRIPTION OF EXEMPLARY EMBODIMENTS

Hereinafter, some preferred embodiments of the invention will be described in detail using the accompanying drawings. It should be noted that the embodiments described below do not unreasonably limit the content of the invention as set forth in the appended claims. Further, all of the constituents described below are not necessarily essential elements of the invention.

1. Real-Time Clock Device

1-1. First Embodiment

Figure 1:
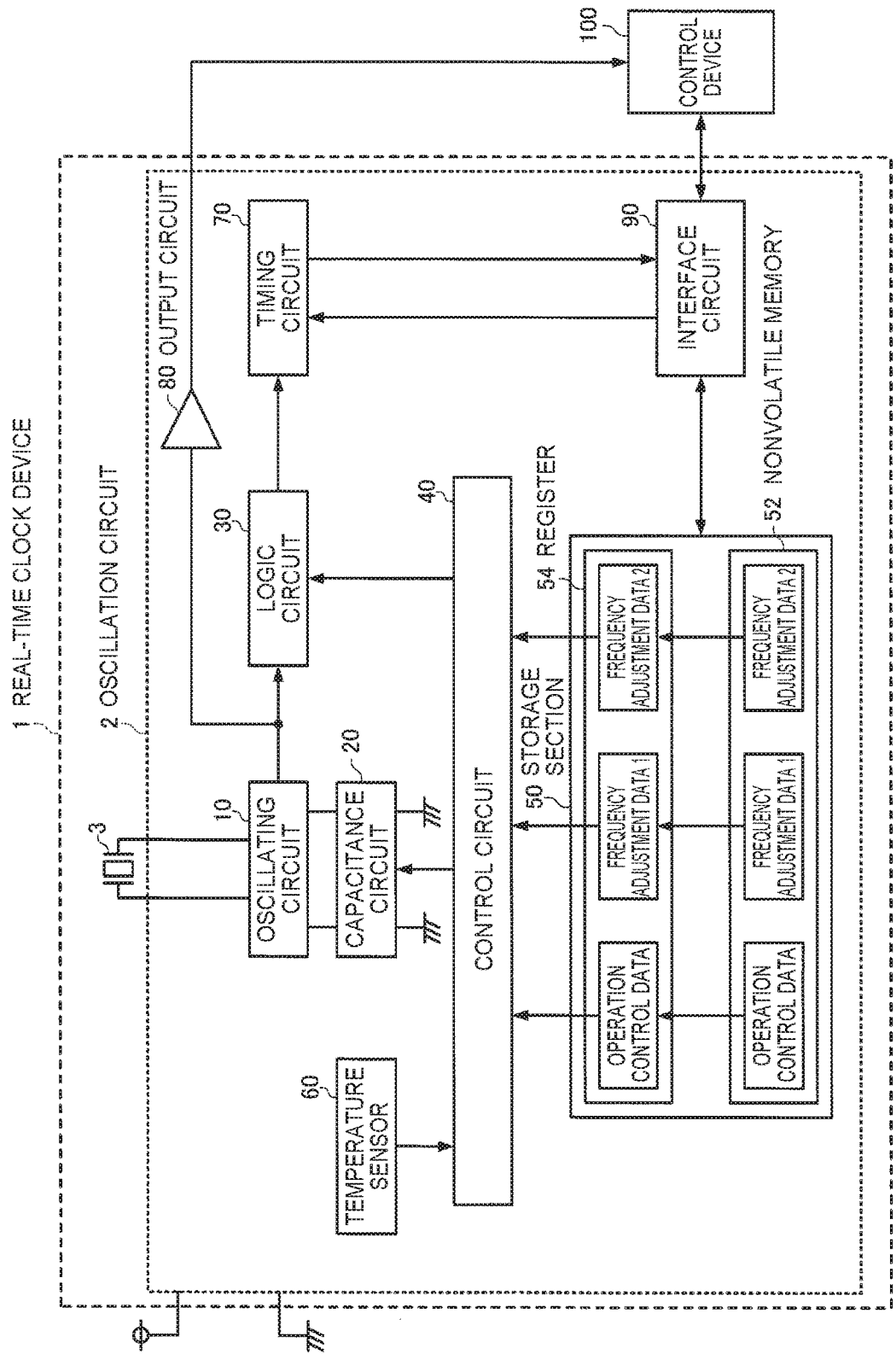
FIG. 1 is a functional block diagram of a real-time clock device according to a first embodiment of the invention.

FIG. 1 is a functional block diagram of a real-time clock device according to the first embodiment. As shown in FIG. 1, the real-time clock device 1 according to the first embodiment is an oscillator including an oscillation circuit 2 and a resonator element 3. In the present embodiment, the real-time clock device 1 is connected to a control device 100.

The resonator element 3 is connected to a package (not shown) via a bonding member such as an electrically conductive or non-electrically conductive adhesive or a bump made of metal, resin, or the like, and is encapsulated in the package in a state of having high airtightness to thereby constitute a resonator, and the oscillation circuit 2 and the resonator (the package airtightly encapsulating the resonator element 3) are housed in a package not shown. Further, the resonator element 3 has excitation electrodes electrically connected to an oscillating circuit 10 described later to oscillate the resonator element 3.

As the resonator element 3, there can be used, for example, a surface acoustic wave (SAW) resonator, an AT-cut crystal resonator element, an SC-cut crystal resonator element, a tuning-fork crystal resonator element, other piezoelectric resonator elements, and a Micro Electro Mechanical Systems (MEMS) resonator element. As a substrate material of the resonator element 3, there can be used a piezoelectric material such as a piezoelectric single crystal such as a quartz crystal, lithium tantalate, or lithium niobate, or piezoelectric ceramics such as lead zirconate titanate, a silicon semiconductor material, or the like. As an excitation device of the resonator element 3, there can be used a device using a piezoelectric effect, or electrostatic drive using a coulomb force.

The oscillation circuit 2 is configured including the oscillating circuit 10, a capacitance circuit 20, a logic circuit 30, a control circuit 40, a storage circuit 50, a temperature sensor 60, a timing circuit 70, an output circuit 80, and an interface circuit 90, and operates using a voltage applied between a power supply terminal and an earth terminal (a ground terminal) as a power supply voltage. It should be noted that the oscillation circuit 2 according to the present embodiment can have a configuration obtained by eliminating or modifying some of these constituents, or adding other constituents.

The oscillation circuit 2 can be configured as a single integrated circuit (IC), or can be constituted by a plurality of integrated circuits (IC). Further, the oscillation circuit 2 can have some of the constituents not integrated, but discretely configured using a plurality of electronic components, for example.

The oscillating circuit 10 is a circuit for oscillating the resonator element 3, and amplifies the output signal of the resonator element 3 and feeds the output signal thus amplified back to the resonator element 3. The oscillating circuit 10 uses the capacitance of the capacitance circuit 20 as the load capacitance, and oscillates the resonator element 3 at a frequency corresponding to the value of the load capacitance.

The capacitance circuit 20 is a circuit, which is connected to the oscillating circuit 10, and has a capacitance value varying in accordance with a control signal from the control circuit 40. For example, the capacitance circuit 20 can include a variable capacitance element (e.g., a varactor) having a capacitance value varying in accordance with the control signal (a control voltage) from the control circuit 40 applied to a terminal of the variable capacitance element. Further, for example, the capacitance circuit 20 can include a capacitance bank circuit, which includes a plurality of capacitive elements and a plurality of switches, and in which each of the switches operates in accordance with the control signal from the control circuit 40, the capacitive elements to be connected to the oscillating circuit 10 are selected in accordance with the operation of the switches, and thus the value of the load capacitance is changed.

As described above, the capacitance circuit 20 is a circuit, which is connected to the oscillating circuit 10 to be controlled in operation by the control circuit 40, and can thus correct the oscillation frequency (the oscillation frequency of the resonator element 3) of the oscillating circuit 10.

The temperature sensor 60 is a thermosensor for outputting a signal (e.g., a voltage corresponding to the temperature) corresponding to the ambient temperature of the temperature sensor 60. The temperature sensor 60 can be a positive type, in which the higher the temperature is, the higher the output voltage is, or can also be a negative type, in which the higher the temperature is, the lower the output voltage is. It should be noted that a device, the output voltage of which varies as linearly as possible with respect to the change in temperature in a desired temperature range in which the operation of the real-time clock device 1 is guaranteed is desirable as the temperature sensor 60. The temperature sensor 60 can also be, for example, a temperature detection circuit using a bandgap of a semiconductor, a thermistor (e.g., a negative temperature coefficient (NTC) thermistor, or a positive temperature coefficient (PTC) thermistor), or a platinum resistor.

A signal output from the oscillating circuit 10 is input to the logic circuit 30, and the logic circuit 30 divides the signal thus input at a division ratio corresponding to the control signal from the control circuit 40, and then outputs the result. For example, the logic circuit 30 can include a divider circuit, which uses the output signal of the oscillating circuit 10 as a clock signal, and the division ratio of which varies in accordance with the control signal from the control circuit 40. Further, for example, the logic circuit 30 can also include a divider circuit with a fixed division ratio, and a circuit, which thins some of the clock pulses from the output signal of the oscillating circuit 10 in accordance with the control signal from the control circuit 40, or adds some clock pulses to the output signal of the oscillating circuit 10, to supply the result as a clock signal of the divider circuit.

As described above, the logic circuit 30 is a circuit capable of correcting the frequency of the signal, which has been output from the oscillating circuit 10 and then input to the logic circuit 30, due to the operation controlled by the control circuit 40. Then, the logic circuit 30 generates a clock signal having a period of, for example, 1 second, and then outputs the clock signal to the timing circuit 70.

The control circuit 40 controls the operation of the capacitance circuit 20 and the operation of the logic circuit 30. In the present embodiment, the control circuit 40 controls ON/OFF (whether or not the correction operation is performed) of the correction operation (the correction operation of the oscillation frequency of the oscillating circuit 10) by the capacitance circuit 20, and ON/OFF (whether or not the correction operation is performed) of the correction operation (the correction operation of the frequency of the output signal of the oscillating circuit 10) by the logic circuit 30 based on operation control data stored in the storage section 50 (a register 54).

Further, in the case of making the capacitance circuit 20 perform the correction operation, the control circuit 40 controls the capacitance value (the load capacitance value of the oscillating circuit 10) of the capacitance circuit 20 based on the output signal of the temperature sensor 60 and frequency adjustment data 1 stored in the storage section 50 (the register 54). Specifically, the control circuit 40 generates a control signal, with which the capacitance value (the load capacitance value of the oscillating circuit 10) of the capacitance circuit 20 becomes the capacitance value for correcting the frequency-temperature characteristic of the resonator element 3, in accordance with the output signal of the temperature sensor 60 and the frequency adjustment data 1, and then outputs the control signal to the capacitance circuit 20. Due to the control signal, there is performed the control of decreasing the frequency deviation of the output signal of the oscillating circuit 10 in a desired temperature range.

As described above, in the present embodiment, the capacitance circuit 20 is a circuit, which is connected to the oscillating circuit 10 to be controlled in operation by the control circuit 40, and can thus correct the frequency-temperature characteristic of the resonator element 3. In order for the correction of the frequency-temperature characteristic of the resonator element 3 by the capacitance circuit 20 to be performed more correctly, it is desirable for the temperature sensor 60 to be disposed at a place (e.g., a place close to the resonator element 3) where the temperature of the resonator element 3 can more accurately be detected. It should be noted that the temperature sensor 60 can also be disposed at a place (e.g., a place close to the oscillating circuit 10, or a place close to the oscillation circuit 2) where the temperature change caused by the operation of the oscillating circuit 10 or the oscillation circuit 2 including the oscillating circuit 10 can be detected.

Further, in the case of making the logic circuit 30 perform the correction operation, the control circuit 40 controls the division ratio of the logic circuit 30 based on frequency adjustment data 2 stored in the storage section 50 (the register 54). Specifically, the control circuit 40 generates a control signal (a correction signal) for the logic circuit 30 to correct the frequency variation other than the frequency-temperature characteristic of the resonator element 3, and outputs the control signal to the logic circuit 30.

As described above, in the present embodiment, the logic circuit 30 is a circuit capable of correcting the frequency variation other than the frequency-temperature characteristic of the resonator element 3, in response to the input of the signal output from the oscillating circuit 10, and due to the operation controlled by the control circuit 40. The correction of the frequency variation other than the frequency-temperature characteristic of the resonator element 3 can also be the correction (aging correction) of a temporal frequency variation of the resonator element 3. The aging correction can also be, for example, the correction of the temporal variation of a deviation (an offset frequency) of the frequency of the signal (the signal on which the correction of the frequency-temperature characteristic of the resonator element 3 has been performed) output from the oscillating circuit 10 with respect to a desired frequency. It should be noted that the correction of the frequency variation other than the frequency-temperature characteristic of the resonator element 3 can also be the correction of an initial frequency deviation (a deviation from the desired frequency at the time of manufacturing of the resonator element 3) of the resonator element 3.

The signal output by the oscillating circuit 10 is input to the output circuit 80, the output circuit 80 generates an oscillation signal for an external output, and is then output the oscillation signal to the outside via an external terminal of the oscillating circuit 10. It is also possible for the output circuit 80 to divide the frequency of the signal output by the oscillating circuit 10 to thereby generate the oscillation signal for the external output. It is possible for the control device 100 to operate using the oscillation signal as the clock signal.

The storage section 50 is configured including a nonvolatile memory 52 and the register 54. The nonvolatile memory 52 is a storage section for storing a variety of data for the control by the control circuit 40, and can be a variety of types of rewritable nonvolatile memory such as an electrically erasable programmable read-only memory (EEPROM) and a flash memory, or can also be a variety of types of non-rewritable nonvolatile memory such as a one-time programmable read-only memory (one-time PROM).

In the present embodiment, the nonvolatile memory 52 stores the frequency adjustment data 1 as the data for controlling the capacitance value (the load capacitance value of the oscillating circuit 10) of the capacitance circuit 20. The frequency adjustment data 1 is the data for the correction operation of the capacitance circuit 20, and can also be zero-order, first-order, and second-order coefficient values (third or higher order coefficient values can also be included) corresponding to the frequency-temperature characteristic of the resonator element 3 if, for example, the frequency-temperature characteristic of the resonator element has a quadratic characteristic with respect to the temperature. Alternatively, the frequency adjustment data 1 can also be correspondence information between the output voltage of the temperature sensor 60 and the capacitance value of the capacitance circuit 20 determined in accordance with the frequency-temperature characteristic of the resonator element 3 in a predetermined temperature range.

Further, the nonvolatile memory 52 stores the frequency adjustment data 2 as the data for controlling the division ratio of the logic circuit 30. The frequency adjustment data 2 is the data for the correction operation of the logic circuit 30, and can also be, for example, data representing the offset frequency.

Further, the nonvolatile memory 52 stores operation control data as the data for controlling ON/OFF (whether or not the correction operation is performed) of the correction operation (the correction operation of the oscillation frequency of the oscillating circuit 10) by the capacitance circuit 20, and ON/OFF (whether or not the correction operation is performed) of the correction operation (the correction operation of the frequency of the output signal of the oscillating circuit 10) by the logic circuit 30.

FIG. 2 is a diagram showing an example of the operation control data, and in the example shown in FIG. 2, if the bit D0 as a control bit of the capacitance circuit 20 is 0, the correction operation of the frequency-temperature characteristic of the resonator element 3 by the capacitance circuit 20 is turned OFF, and if the bit D0 is 1, the correction operation is turned ON. Further, if the bit D1 as a control bit of the logic circuit 30 is 0, the aging correction operation by the logic circuit 30 is turned OFF, and if the bit D1 is 1, the correction operation is turned ON.

Each of the data (the operation control data, the frequency adjustment data 1, and the frequency adjustment data 2) stored in the nonvolatile memory 52 are transferred from the nonvolatile memory 52 to the register 54, when powering on (when the voltage between the power terminal and the earth terminal (the ground terminal) rises from 0 V to an operable voltage) the real-time clock device 1 (the oscillation circuit 2), and are then held in the register 54.

In the present embodiment, the oscillation circuit 2 is configured so that reading/writing can be performed on the storage section 50 (the nonvolatile memory 52 and the register 54) via the interface circuit 90. The interface circuit 90 can be an interface circuit compatible with a variety of types of serial bus such as SPI (Serial Peripheral Interface) and I²C (Inter-Integrated Circuit), or can also be an interface circuit compatible with a parallel bus.

The operation control data is determined in accordance with, for example, the specification or the intended use of the real-time clock device 1, and is written to the nonvolatile memory 52 by an inspection device not shown in the manufacturing process (an inspection process) of the real-time clock device 1.

Further, the real-time clock device 1 is set at each of temperatures by the inspection device not shown in, for example, the manufacturing process (the inspection process) of the real-time clock device 1, and the frequency adjustment data 1 is determined based on the frequency of the oscillation signal output from the output circuit 80 at each of the temperatures, and is then written into the nonvolatile memory 52.

Further, the frequency adjustment data 2 is determined based on the frequency of the oscillation signal output from the output circuit 80 in the state in which the real-time clock device 1 is set at a reference temperature (e.g., 25° C.) in, for example, the manufacturing process (the inspection process) of the real-time clock device 1, and is then written into the nonvolatile memory 52.

Further, in the present embodiment, after the real-time clock device 1 starts the operation, the control device 100 measures the frequency of the oscillation signal output by the output circuit 80 at nonregular timings every several months through several years, or with a regular period, to calculate the offset frequency. Alternatively, it is also possible for the control device 100 to calculate the elapsed time after manufacture based on the information such as date of manufacture of the real-time clock device 1, and then calculate the offset frequency in accordance with the elapsed time. On this occasion, it is also possible to store the information such as the date of manufacture of the real-time clock device 1 in the nonvolatile memory 52 of the real-time clock device 1 in, for example, the manufacturing process (the inspection process) of the real-time clock device 1 in advance, and then make the control device 100 retrieve the information such as the date of manufacture from the nonvolatile memory 52. Alternatively, it is also possible to store information of the serial number of the real-time clock device 1 in the nonvolatile memory 52 of the real-time clock device 1 in the manufacturing process (the inspection process) of the real-time clock device 1 in advance, and then make the control device 100 retrieve the information of the serial number from the nonvolatile memory 52 to identify the date of manufacture using a correspondence table between the serial number of the real-time clock device 1 and the date of manufacture.

Then, the control device 100 writes the information of the offset frequency calculated or estimated in the register 54 (the control device 100 can also write the information in the nonvolatile memory 52) as the frequency adjustment data 2 via the interface circuit 90. The control circuit 40 makes the logic circuit 30 perform the aging correction operation based on the frequency adjustment data 2.

Figure 3:
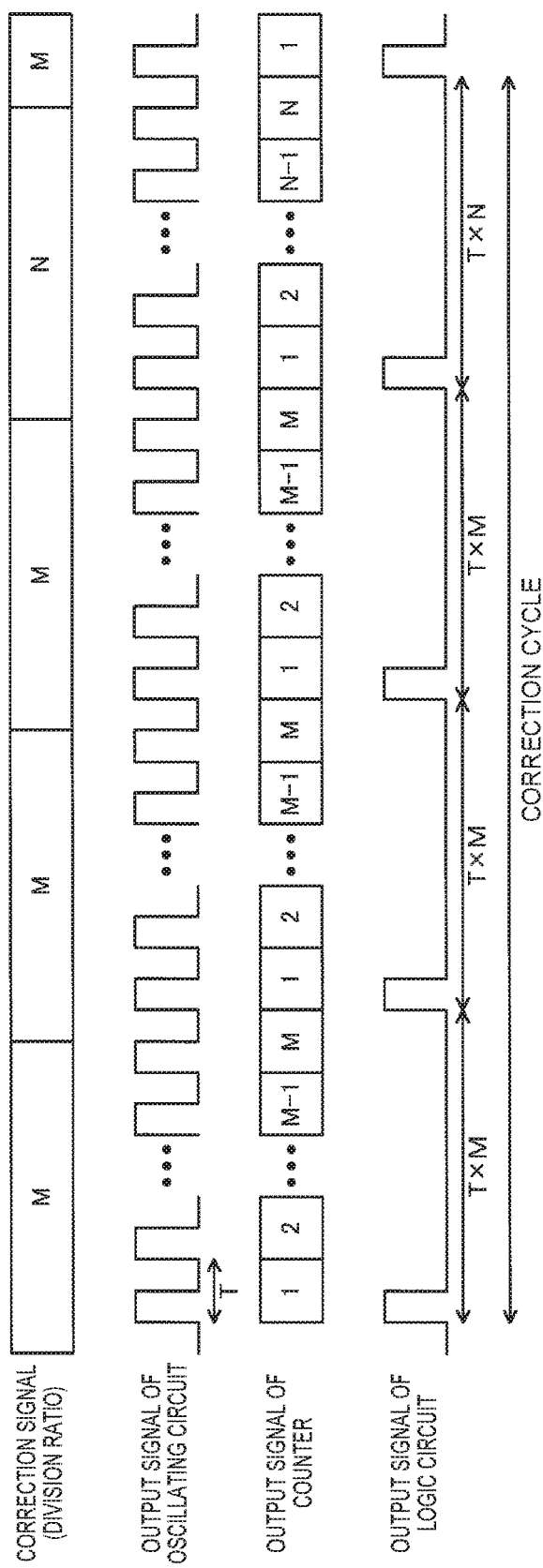
FIG. 3 is a timing chart showing an example of an aging correction operation by a logic circuit.

FIG. 3 is a timing chart showing an example of the aging correction operation by the logic circuit 30. In the example shown in FIG. 3, the control circuit 40 outputs the correction signal for setting the division ratio to M in three periods and setting the division ratio to N in one period during four periods of the output signal of the logic circuit 30 based on the frequency adjustment data 2. Then, the logic circuit 30 counts the division ratio of the correction signal with a counter (not shown in FIG. 1), and generates a pulse in the output signal every time the count value coincides with the division ratio.

Since the division ratio is always M in the case in which the correction operation by the logic circuit 30 is not performed, by the correction operation being performed by the logic circuit 30, the average value of the period of the output signal of the logic circuit 30 is corrected to {(3M+N)/4} times. As a result of such an aging correction by the logic circuit 30, it is possible to make the average value of the period of the output signal of the logic circuit 30 coincide with a predetermined time (e.g., 1 second). The control circuit 40 sets N to a smaller value than M in the case in which the oscillation frequency (the oscillation frequency of the resonator element 3) of the oscillating circuit 10 is lower than a desired frequency, and sets N to a larger value than M in the case in which the oscillation frequency is higher than the desired frequency based on the frequency adjustment data 2.

The timing circuit 70 generates clock time information (information of year, month, day, hour, minute, second, and so on) based on the signal (e.g., a clock signal with the period of 1 second) output by the logic circuit 30. The clock time information is assigned to a predetermined address of the register 54, and it is possible for the control device 100 to access the address of the register 54 via the interface circuit 90 to retrieve the clock time information. It should be noted that the clock time information generated in the timing circuit 70 can be corrected or generated based on, for example, the reference clock time information input from the control device 100 to the interface circuit 90.

Further, it is also possible for the timing circuit 70 to have an alarm function, and to output a signal (e.g., an interrupt signal) representing the fact that the time preset to the register 54 from the control device 100 via the interface circuit 90 has been reached. The control device 100 can receive the signal to perform a predetermined process.

Further, it is also possible for the timing circuit 70 to have a timer function, and to measure the time having been preset to the register 54 from the control device 100 via the interface circuit 90 to output a signal (e.g., an interrupt signal) representing the fact that the measurement has been completed. The control device 100 can receive the signal to perform a predetermined process.

It should be noted that although in the example shown in FIG. 3, the cycle length (correction cycle) of the correction operation by the logic circuit 30 corresponds to four periods of the output signal of the logic circuit 30, the longer the correction cycle is, the higher the correction accuracy (resolution) becomes. It should be noted that if the correction cycle is elongated, the correction amount also increases, and therefore, there occurs a state in which one of the periods of the output signal of the logic circuit 30 alone is extremely long or short in each of the correction cycles, and there is a possibility that the operation of the timing circuit 70 becomes unallowable. Therefore, in general, it is desirable to make the correction cycle as short as possible within a range in which the necessary frequency accuracy is fulfilled.

In the real-time clock device 1 (the oscillation circuit 2) according to the first embodiment described hereinabove, it is possible for the control circuit 40 to control ON/OFF of the correction operation of the frequency-temperature characteristic of the resonator element 3 by the capacitance circuit 20 and ON/OFF of the correction operation (the aging correction operation) of the frequency variation other than the frequency-temperature characteristic of the resonator element 3 by the logic circuit 30 independently of each other based on such operation control data as shown in FIG. 2. Therefore, according to the real-time clock device 1 (the oscillation circuit 2) related to the first embodiment, the correction method of the oscillation frequency can be selected depending on the intended use.

Figure 4:
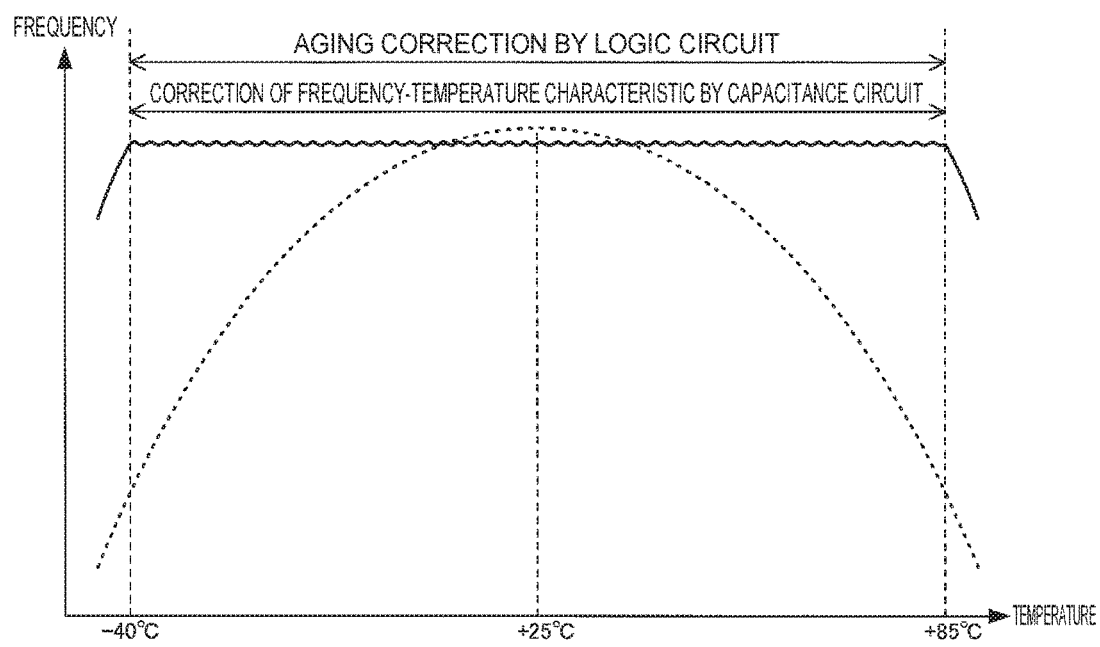
FIG. 4 is a diagram showing an example of a correction operation and the frequency-temperature characteristic of an output signal of the logic circuit in the first embodiment.

In the case in which, for example, both of the bit D0 and the bit D1 in the example shown in FIG. 2 are set to 0, the capacitance circuit 20 and the logic circuit 30 do not perform the correction operations. Therefore, in this case, as indicated by the dotted line in FIG. 4, the frequency-temperature characteristic of the output signal of the logic circuit 30 becomes the curve corresponding to the frequency-temperature characteristic of the resonator element 3, and further, the oscillation frequency at the reference temperature (e.g., 25° C.) deviates from the desired frequency (e.g., 1 Hz). In the case in which, for example, it is sufficient that some oscillation signal is output from the real-time clock device 1, by adopting the setting in which neither the capacitance circuit 20 nor the logic circuit 30 performs the correction operations, it is possible to reduce the current consumption caused by charging or discharging the capacitance of the capacitance circuit 20 and the current consumption due to the operation of the logic circuit 30 to thereby realize lower power consumption of the real-time clock device 1 (the oscillation circuit 2).

Further, in the case in which, for example, both of the bit D0 and the bit D1 of the example shown in FIG. 2 are set to 1, the capacitance circuit 20 corrects the frequency-temperature characteristic of the resonator element 3, and the logic circuit 30 corrects the temporal variation of the oscillation frequency in the temperature range (e.g., not lower than −40° C. and not higher than +85° C.) in which the operation of the oscillation circuit 2 is guaranteed. Therefore, in this case, as indicated by the solid line in FIG. 4, the frequency of the output signal of the logic circuit 30 is corrected so as to approximate to the desired frequency (e.g., 1 Hz) irrespective of the temperature and the elapsed time in the temperature range (e.g., not lower than −40° C. and not higher than +85° C.) in which the operation of the oscillation circuit 2 is guaranteed. In the case in which, for example, the temperature range in which the real-time clock device 1 is used is broad, and such high frequency accuracy as to require the correction of the temporal variation of the oscillation frequency is required, by adopting the setting of making both of the capacitance circuit 20 and the logic circuit 30 perform the correction operations, it is possible to realize the real-time clock device 1 (the oscillation circuit 2) which fulfills the high frequency accuracy in the broad temperature range for a long period of time.

1-2. Second Embodiment

Figure 5:
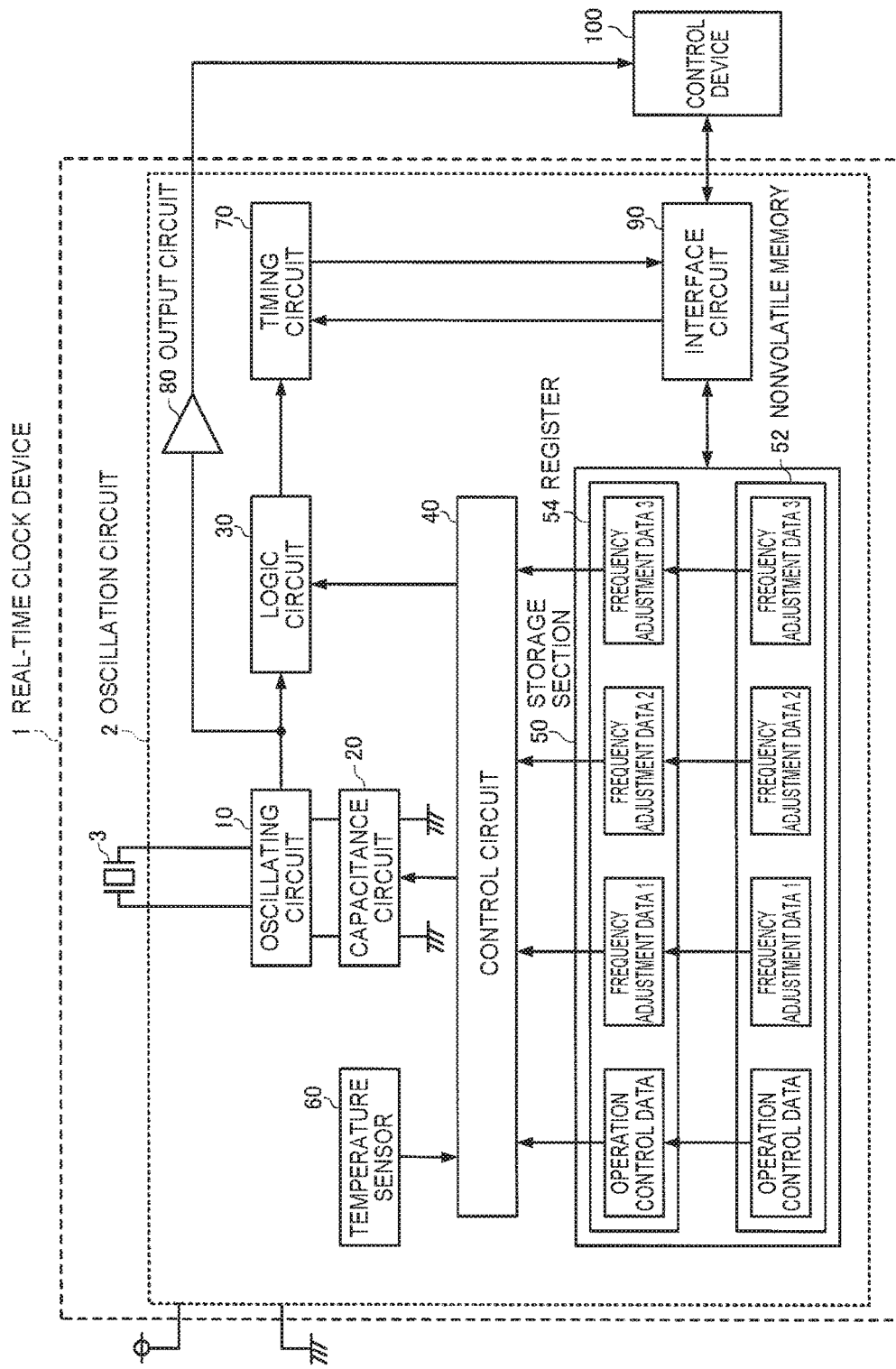
FIG. 5 is a functional block diagram of a real-time clock device according to a second embodiment of the invention.

FIG. 5 is a functional block diagram of a real-time clock device according to a second embodiment. In FIG. 5, the constituents substantially the same as those in FIG. 1 are denoted by the same reference symbols, and the second embodiment will hereinafter be described with a focus on different contents from the first embodiment, and the description redundant to the first embodiment will be omitted.

In the second embodiment, the control circuit 40 controls the operation of the capacitance circuit 20, and at the same time, controls the operation (e.g., the aging correction operation) of the logic circuit 30 correcting the frequency variation other than the frequency-temperature characteristic of the resonator element 3 and the operation of the logic circuit 30 correcting the frequency-temperature characteristic of the resonator element 3. Specifically, the control circuit 40 controls ON/OFF of the correction operation of the frequency-temperature characteristic of the resonator element 3 by the capacitance circuit 20, ON/OFF of the correction operation of the frequency variation other than the frequency-temperature characteristic of the resonator element 3 by the logic circuit 30, and ON/OFF of the correction operation of the frequency-temperature characteristic of the resonator element 3 by the logic circuit 30 based on the operation control data stored in the storage section 50 (the register 54).

In the case of making the capacitance circuit 20 perform the correction operation of the frequency-temperature characteristic of the resonator element 3, the control circuit 40 controls the capacitance value (the load capacitance value of the oscillating circuit 10) of the capacitance circuit 20 based on the output signal of the temperature sensor 60 and the frequency adjustment data 1 stored in the storage section 50 (the register 54) similarly to the first embodiment.

Further, in the case of making the logic circuit 30 perform the correction operation of the frequency variation other than the frequency-temperature characteristic of the resonator element 3, the control circuit 40 controls the division ratio of the logic circuit 30 based on the frequency adjustment data 2 stored in the storage section 50 (the register 54) similarly to the first embodiment.

Further, in the case of making the logic circuit 30 perform the correction operation of the frequency-temperature characteristic of the resonator element 3, the control circuit 40 controls the division ratio of the logic circuit 30 based on the output signal of the temperature sensor 60 and frequency adjustment data 3 stored in the storage section 50 (the register 54). Specifically, the control circuit 40 generates a control signal, with which the division ratio of the logic circuit 30 becomes the division ratio for correcting the frequency-temperature characteristic (the frequency-temperature characteristic of the oscillating circuit 10) of the resonator element 3, in accordance with the output signal of the temperature sensor 60 and the frequency adjustment data 3, and then outputs the control signal to the logic circuit 30. Due to the control signal, there is performed the control of decreasing the frequency deviation of the output signal of the logic circuit 30 in a desired temperature range.

As described above, in the second embodiment, the logic circuit 30 is a circuit capable of correcting the frequency variation (e.g., a temporal frequency variation) other than the frequency-temperature characteristic of the resonator element 3, and further capable of correcting the frequency-temperature characteristic of the resonator element 3 in response to the input of the signal output from the oscillating circuit 10, and due to the operation controlled by the control circuit 40.

Figures 6, 7:
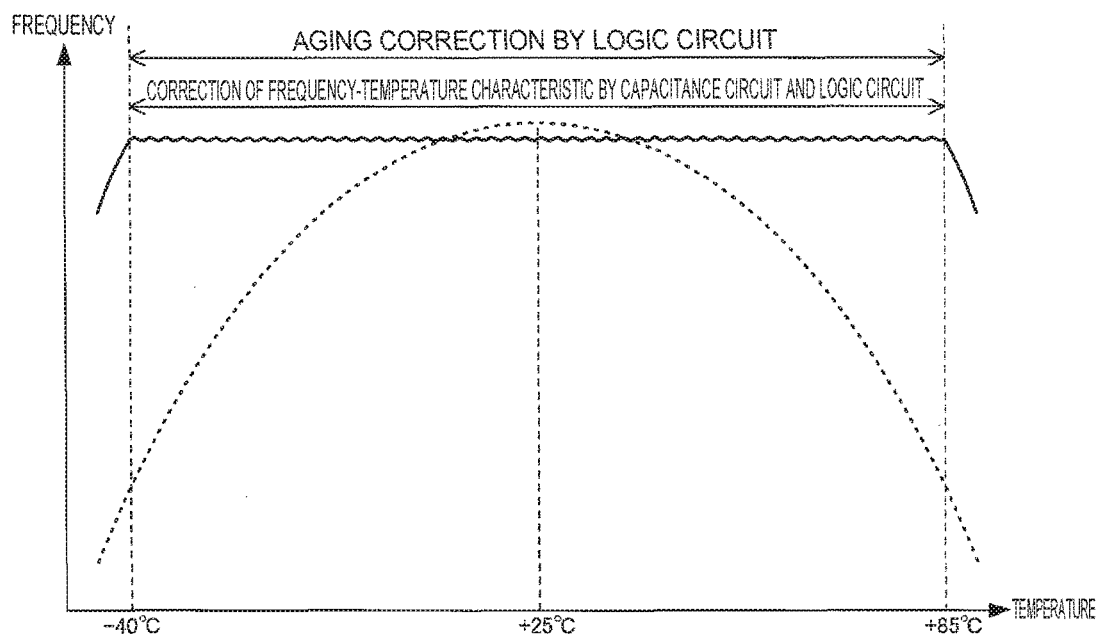
FIG. 6 is a diagram showing an example of operation control data in the second embodiment.
FIG. 7 is a diagram showing an example of a correction operation and the frequency-temperature characteristic of an output signal of a logic circuit in the second embodiment.

As shown in FIG. 5, in the second embodiment, in the nonvolatile memory 52, there are stored the operation control data, the frequency adjustment data 1, and the frequency adjustment data 2 similarly to the first embodiment. It should be noted that the configuration of the operation control data is different from that of the first embodiment. FIG. 6 is a diagram showing an example of the operation control data in the second embodiment. In the example shown in FIG. 6, if the bit D0 as the control bit of the capacitance circuit 20 is 0, the correction operation of the frequency-temperature characteristic of the resonator element 3 by the capacitance circuit 20 is turned OFF, and if the bit D0 is 1, the correction operation is turned ON. Further, if the bit D1 as the control bit of the logic circuit 30 is 0, the aging correction operation by the logic circuit 30 is turned OFF, and if the bit D1 is 1, the correction operation is turned ON. Further, if the bit D2 as the control bit of the logic circuit 30 is 0, the correction operation of the frequency-temperature characteristic of the resonator element 3 by the logic circuit 30 is turned OFF, and if the bit D2 is 1, the correction operation is turned ON.

Further, in the second embodiment, the nonvolatile memory 52 stores the frequency adjustment data 3. The frequency adjustment data 3 is data for controlling the division ratio of the logic circuit 30 so as to correct the frequency-temperature characteristic of the resonator element 3. Specifically, the frequency adjustment data 3 can also be correspondence information between the output voltage of the temperature sensor 60 and the division ratio of the logic circuit 30 determined in accordance with the frequency-temperature characteristic of the resonator element 3. Alternatively, the frequency adjustment data 3 can also be data for controlling the division ratio of the logic circuit 30 so as to correct the frequency-temperature characteristic of the resonator element 3, which has not sufficiently been corrected by the capacitance circuit 20 and has thus remained, and can also be, for example, correspondence information between the output voltage of the temperature sensor 60 and the division ratio of the logic circuit 30 determined in accordance with the frequency-temperature characteristic of the output signal (the signal on which the correction of the frequency-temperature characteristic of the resonator element 3 has been performed by the capacitance circuit 20) of the oscillating circuit 10.

The real-time clock device 1 is set at each of temperatures by the inspection device not shown in, for example, the manufacturing process (the inspection process) of the real-time clock device 1, and the frequency adjustment data 3 is determined based on the frequency of the oscillation signal output from the output circuit 80 at each of the temperatures, and is then written into the nonvolatile memory 52.

Similarly to the first embodiment, the data (the operation control data, the frequency adjustment data 1, the frequency adjustment data 2, and the frequency adjustment data 3) stored in the nonvolatile memory 52 are transferred from the nonvolatile memory 52 to the register 54 when powering on the real-time clock device 1 (the oscillation circuit 2), and are then held in the register 54.

The rest of the configuration and the function of the real-time clock device 1 (the oscillation circuit 2) according to the second embodiment are substantially the same as those of the first embodiment.

In the real-time clock device 1 (the oscillation circuit 2) according to the second embodiment described hereinabove, it is possible for the control circuit 40 to control ON/OFF of the correction operation of the frequency-temperature characteristic of the resonator element 3 by the capacitance circuit 20, ON/OFF of the correction operation (the aging correction operation) of the frequency variation other than the frequency-temperature characteristic of the resonator element 3 by the logic circuit 30, and ON/OFF of the correction operation of the frequency-temperature characteristic of the resonator element 3 by the logic circuit 30 independently of each other based on such operation control data as shown in FIG. 6. Therefore, according to the real-time clock device 1 (the oscillation circuit 2) related to the second embodiment, the correction method of the oscillation frequency can be selected depending on the intended use with a higher degree of freedom than in the first embodiment.

In the case in which, for example, the bit D0, the bit D1, and the bit D2 in the example shown in FIG. 6 are all set to 0, since neither the capacitance circuit 20 nor the logic circuit 30 performs the correction operations, the frequency-temperature characteristic of the output signal of the logic circuit 30 becomes a curve corresponding to the frequency-temperature characteristic of the resonator element 3 as indicated by the dotted line in FIG. 7, and further, the oscillation frequency at the reference temperature (e.g., 25° C.) deviates from the desired frequency (e.g., 1 Hz) due to the temporal variation. In the case in which, for example, it is sufficient that some oscillation signal is output from the real-time clock device 1, by adopting the setting in which neither the capacitance circuit 20 nor the logic circuit 30 performs the correction operations, lower power consumption can be realized.

Further, in the case in which, for example, all of the bit D0, the bit D1, and the bit D2 of the example shown in FIG. 6 are set to 1, the capacitance circuit 20 and the logic circuit 30 correct the frequency-temperature characteristic of the resonator element 3, and the logic circuit 30 corrects the deviation (the offset frequency) of the oscillation frequency based on the aging in the temperature range (e.g., not lower than −40° C. and not higher than +85° C.) in which the operation of the oscillation circuit 2 is guaranteed. Therefore, in this case, as indicated by the solid line in FIG. 7, the frequency of the output signal of the logic circuit 30 is corrected so as to approximate to the desired frequency (e.g., 1 Hz) irrespective of the temperature in the temperature range (e.g., not lower than −40° C. and not higher than +85° C.) in which the operation of the oscillation circuit 2 is guaranteed. In the case in which, for example, the temperature range in which the real-time clock device 1 is used is broad, and extremely high frequency accuracy is required, by adopting the setting of making the capacitance circuit 20 and the logic circuit 30 perform all of the correction operations, it is possible to realize the real-time clock device 1 (the oscillation circuit 2) which fulfills the extremely high frequency accuracy in the broad temperature range.

1-3. Third Embodiment

Figure 8:
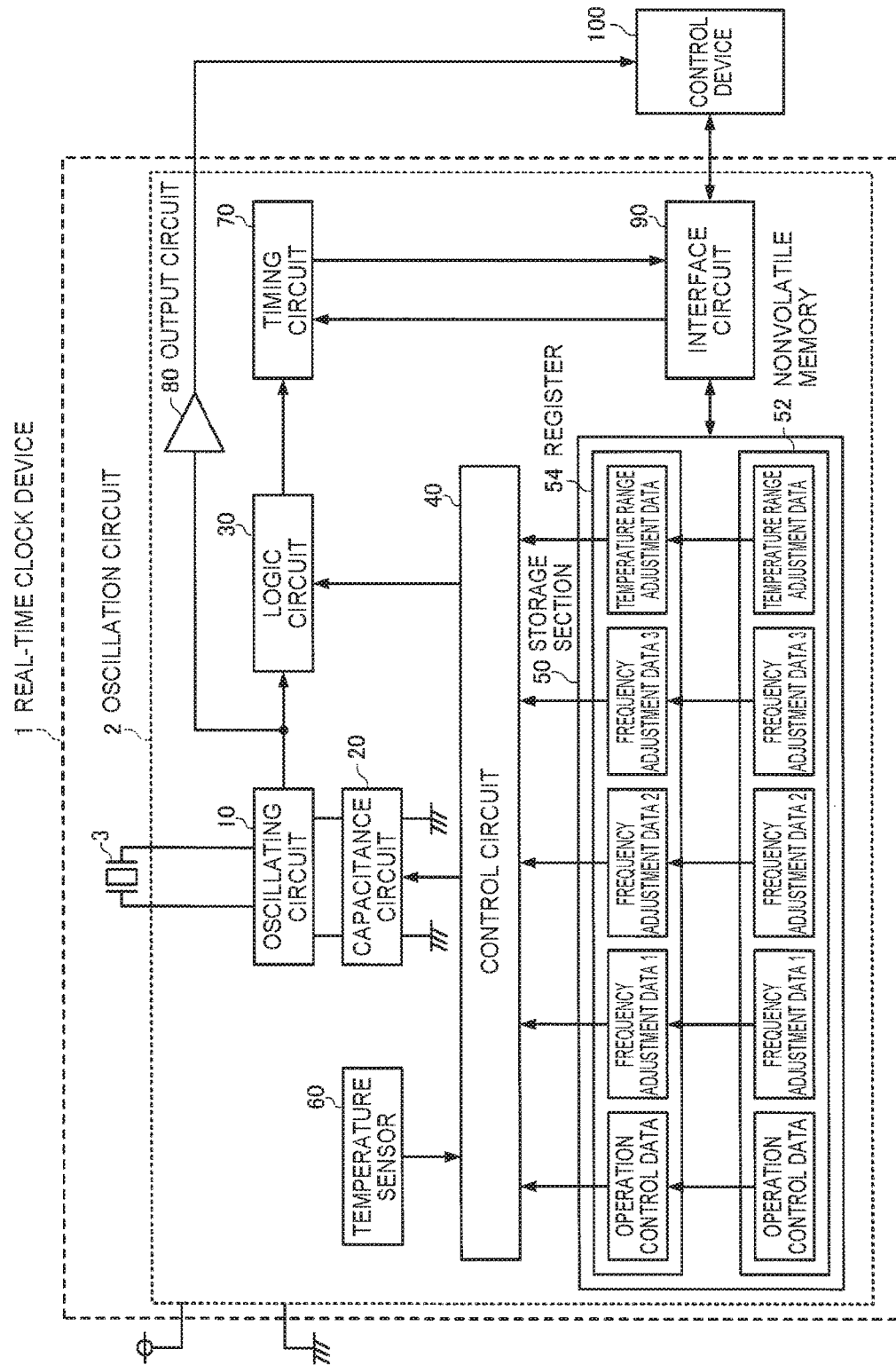
FIG. 8 is a functional block diagram of a real-time clock device according to a third embodiment of the invention.

FIG. 8 is a functional block diagram of a real-time clock device according to a third embodiment. In FIG. 8, the constituents substantially the same as those in FIG. 1 or FIG. 5 are denoted by the same reference symbols, and the third embodiment will hereinafter be described with a focus on different contents from the first embodiment and the second embodiment, and the description redundant to the first embodiment or the second embodiment will be omitted.

In the third embodiment, the control circuit 40 controls the operation of the capacitance circuit 20 correcting the frequency-temperature characteristic of the resonator element 3 in a predetermined temperature range and the operation outside the predetermined temperature range separately from each other. Further, the control circuit 40 controls the operation (e.g., the aging correction operation) of the logic circuit 30 correcting the frequency variation other than the frequency-temperature characteristic of the resonator element 3, and at the same time, controls the operation of the logic circuit 30 correcting the frequency-temperature characteristic of the resonator element 3 in a predetermined temperature range and the operation outside the predetermined temperature range separately from each other. Specifically, the control circuit 40 controls ON/OFF of the correction operation of the frequency-temperature characteristic of the resonator element by the capacitance circuit 20 in the predetermined temperature range, and ON/OFF of the correction operation of the frequency-temperature characteristic of the resonator element 3 by the capacitance circuit 20 outside the predetermined temperature range based on the operation control data stored in the storage section 50 (the register 54). Further, the control circuit 40 controls ON/OFF of the correction operation of the frequency variation other than the frequency-temperature characteristic of the resonator element 3 by the logic circuit 30, ON/OFF of the correction operation of the frequency-temperature characteristic of the resonator element 3 by the logic circuit 30 in the predetermined temperature range, and ON/OFF of the correction operation of the frequency-temperature characteristic of the resonator element 3 by the logic circuit 30 outside the predetermined temperature range based on the operation control data.

In the case of making the capacitance circuit 20 perform the correction operation of the frequency-temperature characteristic of the resonator element 3 in at least one of the inside and the outside of the predetermined temperature range, the control circuit 40 controls the capacitance value (the load capacitance value of the oscillating circuit 10) of the capacitance circuit 20 based on the output signal of the temperature sensor 60 and the frequency adjustment data 1 stored in the storage section 50 (the register 54) similarly to the first embodiment.

Further, in the case of making the logic circuit 30 perform the correction operation of the frequency variation other than the frequency-temperature characteristic of the resonator element 3, the control circuit 40 controls the division ratio of the logic circuit 30 based on the frequency adjustment data 2 stored in the storage section 50 (the register 54) similarly to the first embodiment.

Further, in the case of making the logic circuit 30 perform the correction operation of the frequency-temperature characteristic of the resonator element 3 in at least one of the inside and the outside of the predetermined temperature range, the control circuit 40 controls the division ratio of the logic circuit 30 based on the output signal of the temperature sensor 60 and the frequency adjustment data 3 stored in the storage section 50 (the register 54) similarly to the second embodiment.

Further, in the case of making at least one of the capacitance circuit 20 and the logic circuit 30 perform the correction operation of the frequency-temperature characteristic of the resonator element 3 in at least one of the inside and the outside of the predetermined temperature range, the control circuit 40 controls the predetermined temperature range based on temperature range adjustment data stored in the storage section 50 (the register 54).

As described above, in the third embodiment, the logic circuit 30 is a circuit capable of correcting the frequency variation (e.g., a temporal frequency variation) other than the frequency-temperature characteristic of the resonator element 3, and further capable of correcting the frequency-temperature characteristic of the resonator element 3 in response to the input of the signal output from the oscillating circuit 10, and due to the operation controlled by the control circuit 40.

As shown in FIG. 8, in the third embodiment, in the nonvolatile memory 52, there are stored the operation control data, the frequency adjustment data 1, the frequency adjustment data 2, and the frequency adjustment data 3 similarly to the second embodiment. It should be noted that the configuration of the operation control data is different from that of the second embodiment. FIG. 9 is a diagram showing an example of the operation control data in the third embodiment. In the example shown in FIG. 9, if the bit D0 as the control bit of the capacitance circuit 20 is 0, the correction operation of the frequency-temperature characteristic of the resonator element 3 by the capacitance circuit 20 in the predetermined temperature range is turned OFF, and if the bit D0 is 1, the correction operation in the predetermined range is turned ON. Further, if the bit D1 as the control bit of the capacitance circuit 20 is 0, the correction operation of the frequency-temperature characteristic of the resonator element 3 by the capacitance circuit 20 outside the predetermined temperature range is turned OFF, and if the bit D1 is 1, the correction operation outside the predetermined temperature range is turned ON. Further, if the bit D2 as the control bit of the logic circuit 30 is 0, the aging correction operation by the logic circuit 30 is turned OFF, and if the bit D2 is 1, the correction operation is turned ON. Further, if the bit D3 as the control bit of the logic circuit 30 is 0, the correction operation of the frequency-temperature characteristic of the resonator element 3 by the logic circuit 30 in the predetermined temperature range is turned OFF, and if the bit D3 is 1, the correction operation in the predetermined temperature range is turned ON. Further, if the bit D4 as the control bit of the logic circuit 30 is 0, the correction operation of the frequency-temperature characteristic of the resonator element 3 by the logic circuit 30 outside the predetermined temperature range is turned OFF, and if the bit D4 is 1, the correction operation outside the predetermined temperature range is turned ON.

Further, in the third embodiment, the nonvolatile memory 52 stores the temperature range adjustment data. The temperature range adjustment data is the data for controlling the predetermined temperature range described above. The temperature range adjustment data can also be, for example, the data representing a partial temperature range (e.g., not lower than 0° C. and not higher than +50° C.) included in the temperature range (e.g., not lower than −40° C. and not higher than +85° C.) in which the operation of the oscillation circuit 2 is guaranteed.

The temperature range adjustment data is determined in accordance with, for example, the specification or the intended use of the real-time clock device 1, and is written to the nonvolatile memory 52 by an inspection device not shown in the manufacturing process (the inspection process) of the real-time clock device 1.

Similarly to the first embodiment, the data (the operation control data, the frequency adjustment data 1, the frequency adjustment data 2, the frequency adjustment data 3, and the temperature range adjustment data) stored in the nonvolatile memory 52 are transferred from the nonvolatile memory 52 to the register 54 when powering on the real-time clock device 1 (the oscillation circuit 2), and are then held in the register 54.

The rest of the configuration and the function of the real-time clock device 1 (the oscillation circuit 2) according to the third embodiment are substantially the same as those of the first embodiment or the second embodiment.

In the real-time clock device 1 (the oscillation circuit 2) according to the third embodiment described hereinabove, it is possible for the control circuit 40 to control ON/OFF of the correction operation of the frequency-temperature characteristic of the resonator element 3 by the capacitance circuit 20, ON/OFF of the correction operation (the aging correction operation) of the frequency variation other than the frequency-temperature characteristic of the resonator element 3 by the logic circuit 30, and ON/OFF of the correction operation of the frequency-temperature characteristic of the resonator element 3 by the logic circuit 30 independently of each other based on such operation control data as shown in FIG. 9. Further, it is also possible for the control circuit 40 to independently control ON/OFF of the correction operation of the frequency-temperature characteristic of the resonator element 3 by the capacitance circuit 20 separately between the inside of the predetermined temperature range and the outside of the predetermined temperature range, and independently control ON/OFF of the correction operation of the frequency-temperature characteristic of the resonator element 3 by the logic circuit separately between the inside of the predetermined temperature range and the outside of the predetermined temperature range based on such operation control data as shown in FIG. 9. Therefore, according to the real-time clock device 1 (the oscillation circuit 2) related to the third embodiment, the correction method of the oscillation frequency can be selected depending on the intended use with a higher degree of freedom than in the first embodiment and the second embodiment.

In the case in which, for example, the bit D0, the bit D1, the bit D2, the bit D3, and the bit D4 in the example shown in FIG. 9 are all set to 0, since neither the capacitance circuit 20 nor the logic circuit 30 performs the correction operations, the frequency-temperature characteristic of the output signal of the logic circuit 30 becomes a curve corresponding to the frequency-temperature characteristic of the resonator element 3 as indicated by the dotted line in FIG. 10, and further, the oscillation frequency at the reference temperature (e.g., 25° C.) deviates from the desired frequency (e.g., 1 Hz) due to the temporal variation. For example, in the case in which it is sufficient that some oscillation signal is output from the real-time clock device 1, and the case in which the device equipped with the real-time clock device 1 operates in an environment in which the temperature is always controlled in the vicinity of the reference temperature (e.g., 25° C.), by adopting the setting in which neither the capacitance circuit 20 nor the logic circuit 30 performs the correction operations, lower power consumption can be realized.

Further, in the case in which, for example, the bit D1 and the bit D3 are set to 0 and the bit D0, the bit D2, and the bit D4 are set to 1 in the example shown in FIG. 9, the logic circuit 30 corrects the deviation (the offset frequency) of the oscillation frequency based on the aging in the temperature range (e.g., not lower than −40° C. and not higher than +85° C.) in which the operation of the oscillation circuit 2 is guaranteed, the capacitance circuit 20 corrects the frequency-temperature characteristic of the resonator element 3 in the predetermined temperature range (e.g., not lower than 0° C. and not higher than +50° C.), and the logic circuit 30 corrects the frequency-temperature characteristic of the resonator element 3 outside the predetermined temperature range (e.g., not lower than −40° C. and lower than 0° C., or higher than +50° C. and not higher than +85° C.). Therefore, in this case, as indicated by the solid line in FIG. 10, the frequency of the output signal of the logic circuit 30 is corrected so as to approximate to the desired frequency (e.g., 1 Hz) irrespective of the temperature in the temperature range (e.g., not lower than −40° C. and not higher than +85° C.) in which the operation of the oscillation circuit 2 is guaranteed. In the case in which, for example, the temperature range in which the real-time clock device 1 is used is broad, and particularly high frequency accuracy is required in the predetermined temperature range including the reference temperature (e.g., 25° C.), by adopting the setting in which the capacitance circuit performs the correction operation of the frequency-temperature characteristic of the resonator element 3 with high accuracy in the predetermined temperature range, and the logic circuit 30 performs the correction operation of the frequency-temperature characteristic of the resonator element 3 outside the predetermined temperature range, it is possible to realize the real-time clock device 1 (the oscillation circuit 2) which ensures the highly accurate oscillation frequency in the predetermined temperature range, and ensures the stable oscillation characteristic outside the predetermined temperature range.

1-4. Fourth Embodiment

Figure 11:
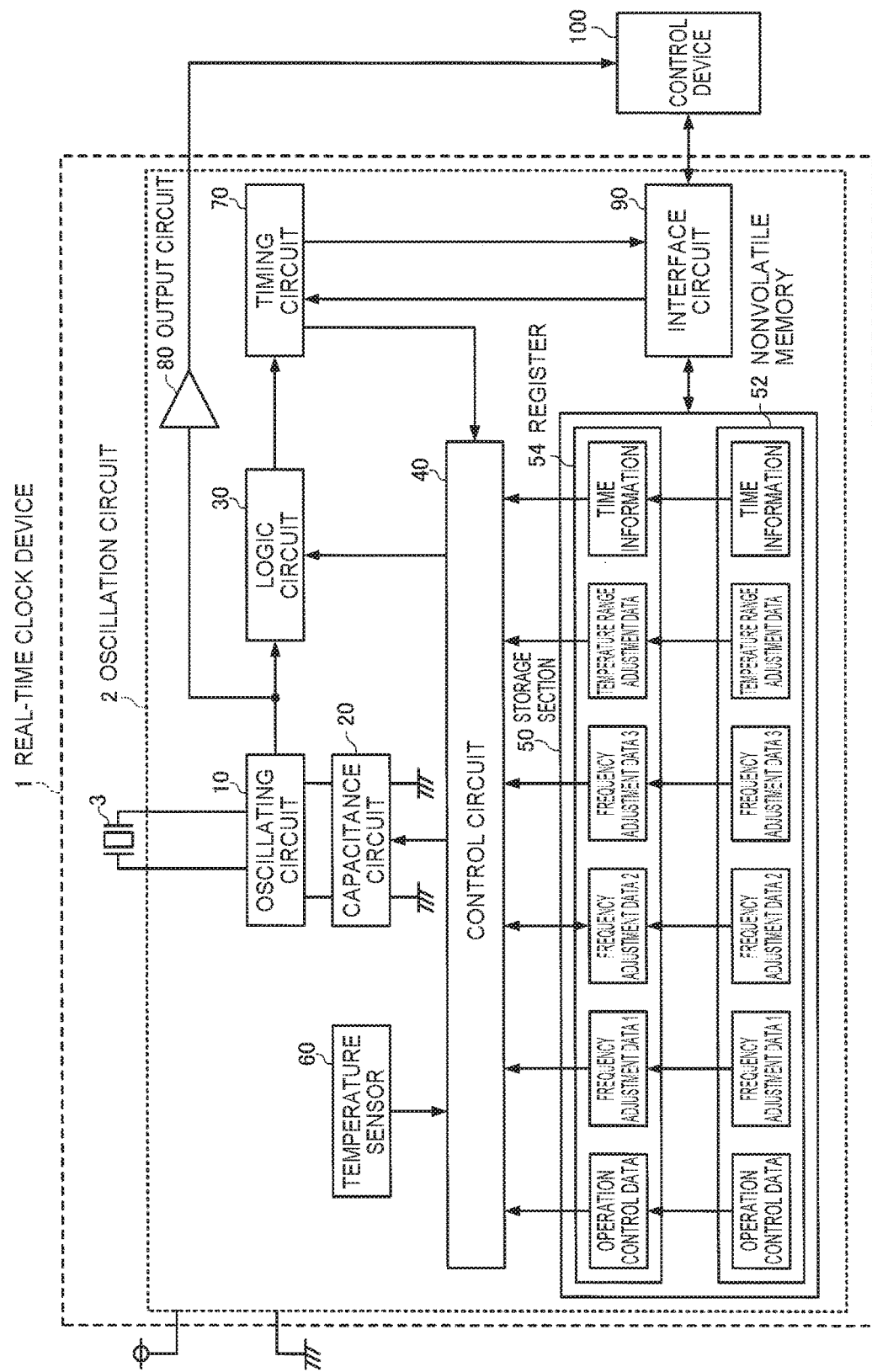
FIG. 11 is a functional block diagram of a real-time clock device according to a fourth embodiment of the invention.

FIG. 11 is a functional block diagram of a real-time clock device according to a fourth embodiment. In FIG. 11, the constituents substantially the same as those in FIG. 1, FIG. 5, or FIG. 8 are denoted by the same reference symbols, and the fourth embodiment will hereinafter be described with a focus on different contents from the first embodiment, the second embodiment, and the third embodiment, and the description redundant to the first embodiment, the second embodiment, or the third embodiment will be omitted.

As shown in FIG. 11, in the fourth embodiment, the storage section 50 (the nonvolatile memory 52) further stores time information in addition to substantially the same data as in the third embodiment. The time information is the information related to, for example, the reference time (zero point) for calculating the elapsed time, and can also be, for example, the information of the date of manufacture of the real-time clock device 1. The time information is written to the nonvolatile memory 52 by the inspection device not shown in the manufacturing process (the inspection process) of the real-time clock device 1.

Similarly to the first embodiment, the data (the operation control data, the frequency adjustment data 1, the frequency adjustment data 2, the frequency adjustment data 3, the temperature range adjustment data, and the time data) stored in the nonvolatile memory 52 are transferred from the nonvolatile memory 52 to the register 54 when powering on the real-time clock device 1 (the oscillation circuit 2), and are then held in the register 54.

The control circuit 40 outputs a control signal (a correction signal) based on the time information held in the register 54 to the logic circuit. Specifically, the control circuit 40 obtains the clock time information (current time) generated by the timing circuit 70 at nonregular timing or at regular intervals to calculate the elapsed time from the reference time (e.g., the date of manufacture) based on the time information held by the register 54. Then, the control circuit 40 calculates the current offset frequency based on the elapsed time thus calculated, and then updates the frequency adjustment data 2 held by the register 54 in accordance with the offset frequency thus calculated (the frequency adjustment data 2 stored in the nonvolatile memory can also be updated). Then, the control circuit 40 generates the correction signal based on the frequency adjustment data 2 thus updated to make the logic circuit 30 perform the aging correction operation. It should be noted that the clock time information generated in the timing circuit 70 can be corrected or generated based on, for example, the reference clock time information input from the control device 100 to the interface circuit 90.

If it is known that the frequency of the resonator element 3 tends to increase due to the factor such as a gas emitted from a bonding member over time, or a change in internal stress of the bonding member, the excitation electrodes, and so on with passage of time, it is sufficient for the control circuit 40 to calculate the offset frequency so that the longer the elapsed time calculated is, the higher the offset frequency is. It should be noted that since the frequency variation of the resonator element 3 with passage of time described above varies by the materials of the excitation electrodes, the package for encapsulating the resonator element 3, and the bonding member, the manufacturing method, and so on, it is also possible for the control circuit 40 to be able to calculate a variety of types of offset frequencies with the elapsed time calculated. For example, it is also possible for the control circuit 40 to calculate the offset frequency so that the longer the elapsed time calculated is, the lower the offset frequency is, the offset frequency can be a positive value or a negative value, the sign of the offset frequency can be changed from positive to negative or from negative to positive with the elapsed time calculated, and the sign of the offset frequency can be changed two or more times.

The rest of the configuration and the function of the real-time clock device 1 (the oscillation circuit 2) according to the fourth embodiment are substantially the same as those of the first embodiment, the second embodiment, or the third embodiment.

The real-time clock device 1 (the oscillation circuit 2) according to the fourth embodiment described hereinabove provides substantially the same advantages as those of the real-time clock devices 1 (the oscillation circuits 2) according to the first through third embodiments.

Further, according to the real-time clock device 1 (the oscillation circuit 2) related to the fourth embodiment, since it is possible for the control circuit 40 to make the logic circuit 30 appropriately correct the frequency variation corresponding to the elapsed time based on the time information, the high frequency accuracy can be maintained even after a long period of time has elapsed.

Further, according to the real-time clock device 1 (the oscillation circuit 2) related to the fourth embodiment, since the aging correction by the logic circuit 30 is automated, it is unnecessary for the external device (the control device 100) to calculate an amount of the temporal variation of the oscillation frequency, and thus, the processing load of the external device can be reduced.

1-5. Fifth Embodiment

Figure 12:
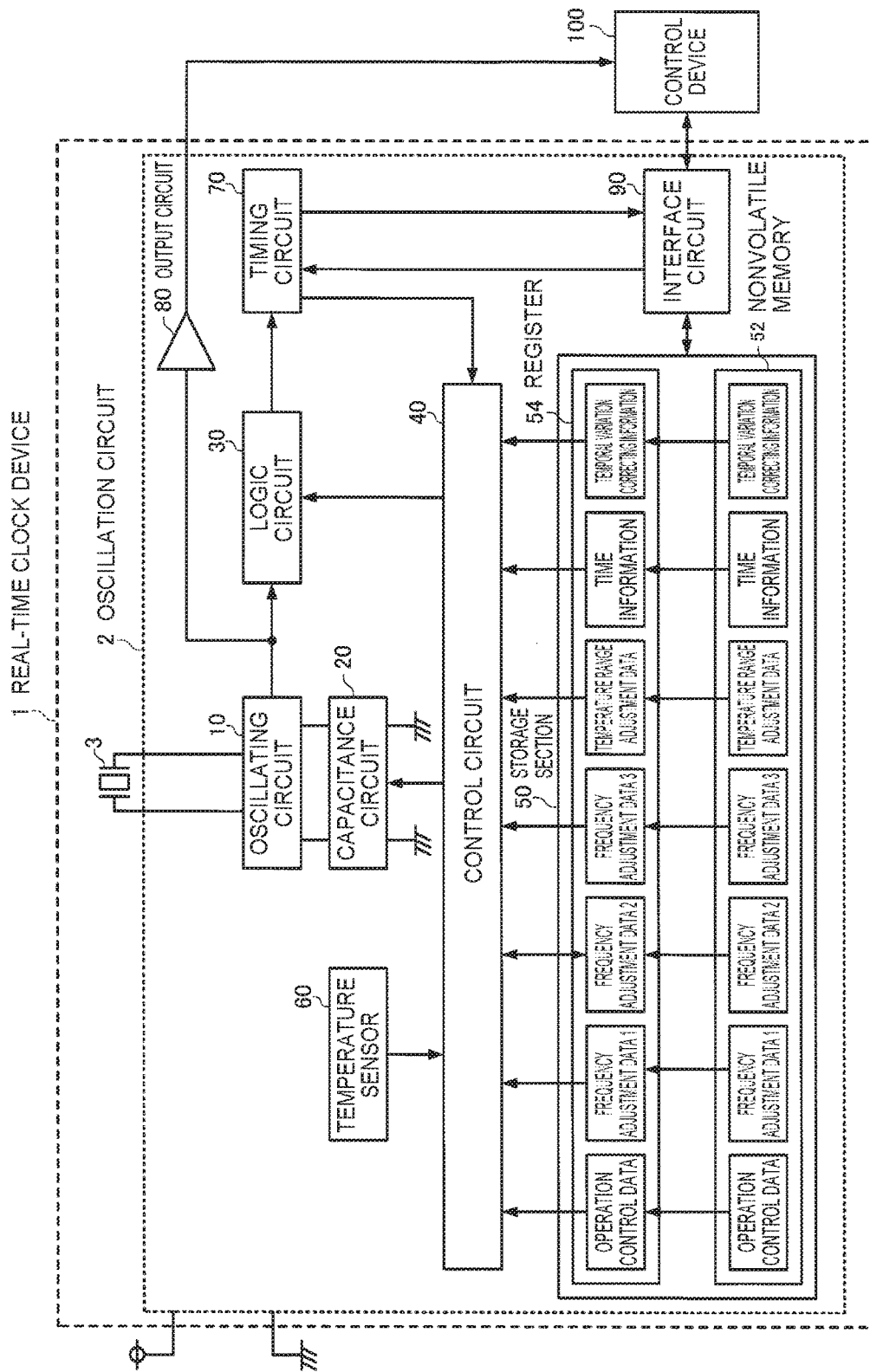
FIG. 12 is a functional block diagram of a real-time clock device according to a fifth embodiment of the invention.

FIG. 12 is a functional block diagram of a real-time clock device according to a fifth embodiment. In FIG. 12, the constituents substantially the same as those in FIG. 1, FIG. 5, or FIG. 8 are denoted by the same reference symbols, and the fifth embodiment will hereinafter be described with a focus on different contents from the first embodiment, the second embodiment, and the third embodiment, and the description redundant to the first embodiment, the second embodiment, or the third embodiment will be omitted.

As shown in FIG. 12, in the fifth embodiment, the storage section 50 (the nonvolatile memory 52) further stores the time information and temporal variation correcting information in addition to substantially the same data as in the third embodiment. The time information is the information related to, for example, the reference time (zero point) for calculating the elapsed time, and can also be, for example, the information of the date of manufacture of the real-time clock device 1. The time information is written to the nonvolatile memory 52 by the inspection device not shown in the manufacturing process (the inspection process) of the real-time clock device 1.

The temporal variation correcting information is the information for calculating the temporal frequency variation (e.g., a calculating formula or tabular information). The calculating formula or the tabular information of the temporal frequency variation is made by performing, for example, averaging on the information obtained by a long-term storage test on a plurality of samples of the real-time clock device 1, and then the calculating formula or the tabular information is written to the nonvolatile memory 52 by the inspection device not shown as the temporal variation correcting information in the manufacturing process (the inspection process) of the real-time clock device 1.

Similarly to the first embodiment, the data (the operation control data, the frequency adjustment data 1, the frequency adjustment data 2, the frequency adjustment data 3, the temperature range adjustment data, the time data, and the temporal variation correcting information) stored in the nonvolatile memory 52 are transferred from the nonvolatile memory 52 to the register 54 when powering on the real-time clock device 1 (the oscillation circuit 2), and are then held in the register 54.

The control circuit 40 outputs a control signal (a correction signal) based on the time information and the temporal variation correcting information held in the register 54 to the logic circuit. Specifically, the control circuit 40 obtains the clock time information (current time) generated by the timing circuit 70 at nonregular timing or at regular intervals to calculate the elapsed time from the reference time (e.g., the date of manufacture) based on the time information held by the register 54.

Then, the control circuit 40 calculates the temporal frequency variation based on the elapsed time thus calculated and the temporal variation correcting information held in the register 54, and then updates the frequency adjustment data 2 held by the register 54 in accordance with the frequency variation thus calculated (the frequency adjustment data 2 stored in the nonvolatile memory 52 can also be updated). Then, the control circuit 40 generates the correction signal based on the frequency adjustment data 2 thus updated to make the logic circuit 30 perform the aging correction operation.

The rest of the configuration and the function of the real-time clock device 1 (the oscillation circuit 2) according to the fifth embodiment are substantially the same as those of the first embodiment, the second embodiment, or the third embodiment.

The real-time clock device 1 (the oscillation circuit 2) according to the fifth embodiment described hereinabove provides substantially the same advantages as those of the real-time clock devices 1 (the oscillation circuits 2) according to the first through third embodiments.

Further, according to the real-time clock device 1 (the oscillation circuit 2) related to the fifth embodiment, since it is possible for the control circuit 40 to make the logic circuit 30 accurately correct the temporal frequency variation using the information based on the actual measurement of the temporal variation of the oscillation frequency, the frequency accuracy higher than that in the fourth embodiment can be maintained even after a long period of time has elapsed.

Further, according to the real-time clock device 1 (the oscillation circuit 2) related to the fifth embodiment, since the aging correction by the logic circuit 30 is automated, it is unnecessary for the external device (the control device 100) to calculate an amount of the temporal variation of the oscillation frequency, and thus, the processing load of the external device can be reduced.

1-6. Modified Examples

In each of the embodiments described above, by the logic circuit 30 performing the frequency division with a period a half of the period of the output signal of the oscillating circuit 10 in sync with the both edges (the rising edge and the falling edge) of the output signal of the oscillating circuit 10, the correction accuracy by the logic circuit 30 can be doubled. For example, it is possible for the logic circuit 30 to include a circuit for generating an exclusive OR (EXOR) signal of the output signal of the oscillating circuit 10 and a signal obtained by delaying the output signal of the oscillating circuit 10 as much as roughly ¼ period, and a frequency divider circuit using the exclusive OR (EXOR) signal as the clock signal for the frequency divider circuit, and varying the division ratio in accordance with the control signal from the control circuit 40. Further, for example, the logic circuit 30 can include a circuit for generating a polarity inversion signal of the output signal of the oscillating circuit 10, a frequency divider circuit with a fixed division ratio, and a circuit for thinning some clock pulses from one of the output signal of the oscillating circuit 10 and the polarity inversion signal in accordance with the control signal from the control circuit 40, and at the same time generating the clock signal while switching to the other of the output signal of the oscillating circuit 10 and the polarity inversion signal, and then supplying the frequency divider circuit with the clock signal.

Further, although in each of the embodiments described above, the oscillation circuit 2 has the capacitance circuit 20 for correcting the frequency-temperature characteristic of the resonator element 3, the capacitance circuit 20 can be eliminated, and it is also possible to correct the frequency-temperature characteristic of the resonator element 3 only with the logic circuit 30.

Further, although in each of the embodiments described above, there is provided the function of correcting the frequency-temperature characteristic of the resonator element 3, this function can be eliminated, and it is also possible for the logic circuit 30 to perform only the aging correction.

Further, although in each of the embodiments described above, the real-time clock device 1 (the oscillation circuit 2) has the temperature sensor 60, the temperature sensor 60 can be eliminated. It is possible that, for example, the control device 100 measures the temperature, and then writes the temperature information thus measured to the register 54 via the interface circuit 90, and then the control circuit 40 retrieves the temperature information from the register 54 to control the correction of the frequency-temperature characteristic of the resonator element 3.

2. Electronic Apparatus

Figure 13:
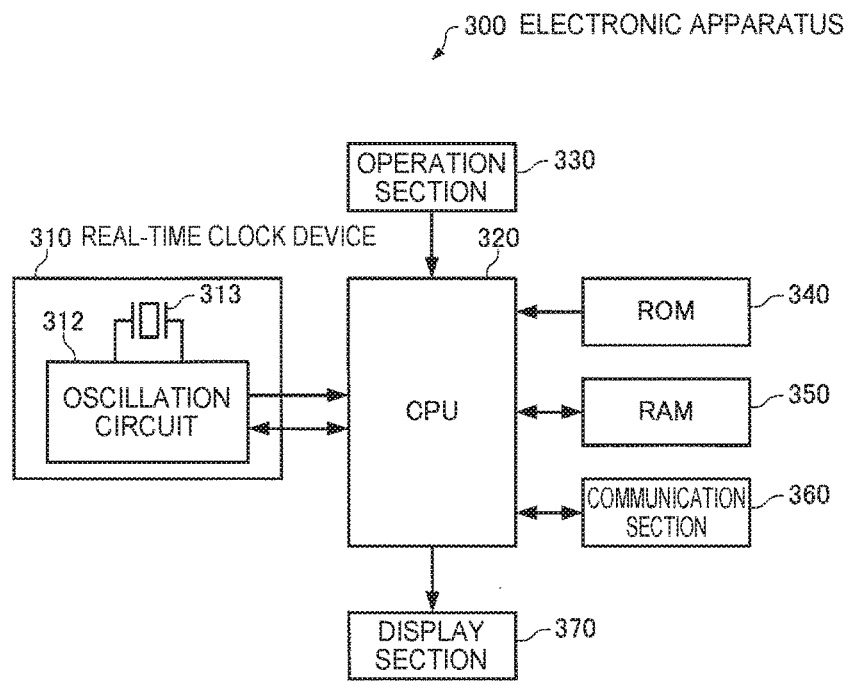
FIG. 13 is a functional block diagram showing an example of a configuration of an electronic apparatus according to the embodiment of the invention.
Figure 14:
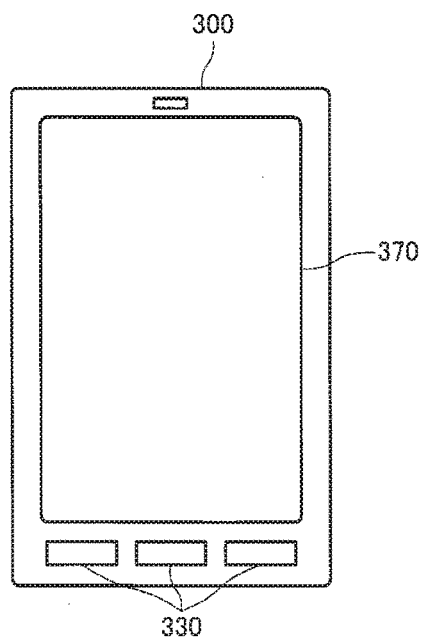
FIG. 14 is a diagram showing an example of an appearance of the electronic apparatus according to the embodiment.

FIG. 13 is a functional block diagram showing an example of a configuration of an electronic apparatus according to the embodiment of the invention. Further, FIG. 14 is a diagram showing an example of the appearance of a smartphone as an example of the electronic apparatus according to the present embodiment.

The electronic apparatus 300 according to the present embodiment is configured including a real-time clock device 310, a central processing unit (CPU) 320, an operation section 330, a read only memory (ROM) 340, a random access memory (RAM) 350, a communication section 360, and a display section 370. It should be noted that the electronic apparatus according to the present embodiment can be provided with a configuration obtained by eliminating or modifying some of the constituents (sections) shown in FIG. 13, or adding another constituent thereto.

The real-time clock device 310 is provided with an oscillation circuit 312 and a resonator element 313. The oscillation circuit 312 oscillates the resonator element 313 to generate an oscillation signal, and generates the clock time information based of the oscillation signal. The real-time clock device 310 (the oscillation circuit 312) outputs the oscillation signal thus generated to the CPU 320.

The CPU 320 performs a variety of types of arithmetic processing and control processing using the oscillation signal input from the real-time clock device 310 as a clock signal in accordance with the program stored in the ROM 340 and so on. Specifically, the CPU 320 performs a variety of processes corresponding to the operation signal from the operation section 330, a process of controlling the communication section 360 for performing data communication with external devices, a process of transmitting a display signal for making the display section 370 display a variety of types of information, and so on. Further, the CPU 320 retrieves the clock time information from the real-time clock device 310 to perform the variety of types of arithmetic processing and control processing.

The operation section 330 is an input device including operation keys, button switches, and so on, and outputs the operation signal corresponding to the operation by the user to the CPU 320.

The ROM 340 stores the programs, data, and so on for the CPU 320 to perform the variety of types of arithmetic processing and control processing.

The RAM 350 is used as a working area of the CPU 320, and temporarily stores, for example, the program and data retrieved from the ROM 340, the data input from the operation section 330, and the calculation result obtained by the CPU 320 performing operations in accordance with the variety of types of programs.

The communication section 360 performs a variety of types of control processing for achieving the data communication between the CPU 320 and external devices.

The display section 370 is a display device formed of a liquid crystal display (LCD) or the like, and displays a variety of types of information based on the display signal input from the CPU 320. The display section 370 can also be provided with a touch panel, which functions as the operation section 330.

It should be noted that the electronic apparatus 300 can be provided with a configuration in which the real-time clock device 310 is replaced with an oscillator including the oscillation circuit 312 not provided with the timing function, and the resonator element 313.

By applying, for example, the oscillation circuit 2 (the timing circuit 70 can be eliminated) according to any one of the embodiments described above as the oscillation circuit 312, or by applying, for example, the real-time clock device 1 according to any one of the embodiments described above as the real-time clock device 310, it is possible to realize the electronic apparatus keeping the high reliability for a long period of time.

As such an electronic apparatus 300, a variety of electronic apparatuses can be adopted, and there can be cited, for example, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router or a switch, a local area network apparatus, a mobile terminal base station apparatus, a television set, a video camera, a video cassette recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments such as a gas meter, a water meter, an electricity meter (a smart meter) each provided with a wired or wireless communication function, and capable of transmitting a variety of data, gauges (e.g., gauges for cars, aircrafts, and boats and ships), a flight simulator, a head-mount display, a motion tracer, a motion tracker, a motion controller, and a pedestrian dead reckoning (PDR) system.

3. Moving Object

Figure 15:
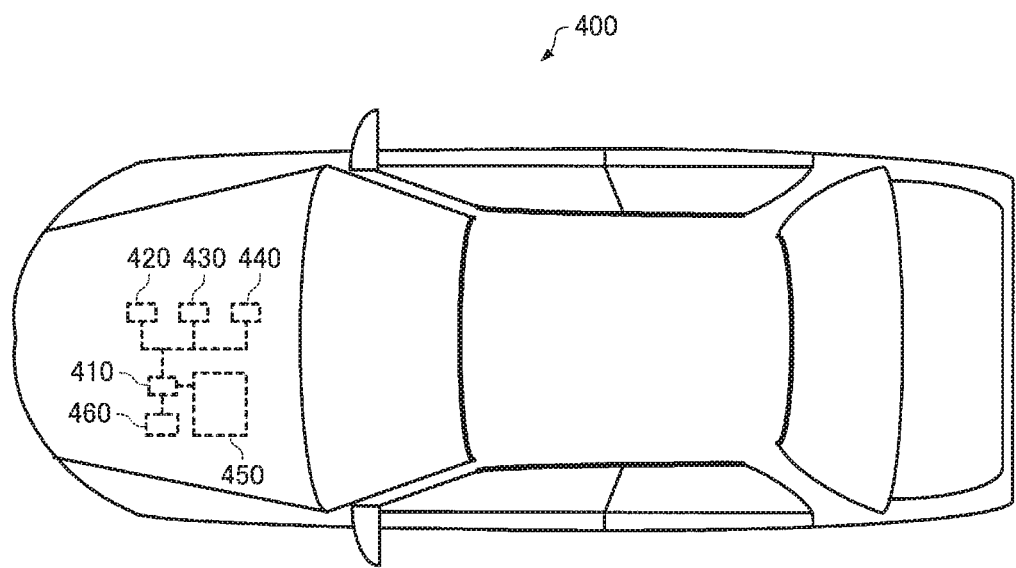
FIG. 15 is a diagram showing an example of a moving object according to an embodiment of the invention.

FIG. 15 is a diagram (a top view) showing an example of a moving object according to the present embodiment. The moving object 400 shown in FIG. 15 is configured including a real-time clock device 410, controllers 420, 430, and 440 for performing a variety of types of control such as an engine system, a brake system, or a keyless entry system, a battery 450, and a backup battery 460. It should be noted that the moving object according to the present embodiment can have a configuration obtained by eliminating some of the constituents (sections) shown in FIG. 15, or adding other constituents thereto.

The real-time clock device 410 is provided with an oscillation circuit and a resonator element not shown, and the oscillation circuit oscillates the resonator element to generate an oscillation signal, and generates the clock time information based on the oscillation signal. The oscillation signal is output from the external terminal of the real-time clock device 410 to the controllers 420, 430, and 440, and is used as, for example, a clock signal.

The battery 450 supplies the real-time clock device 410 and the controllers 420, 430, and 440 with electrical power. The backup battery 460 supplies the real-time clock device 410 and the controllers 420, 430, and 440 with electrical power when the output voltage of the battery 450 drops to a level lower than a threshold value.

It should be noted that the moving object 400 can be provided with a configuration in which the real-time clock device 410 is replaced with an oscillator including the oscillation circuit not provided with the timing function, and the resonator element.

By applying, for example, the oscillation circuit 2 (the timing circuit 70 can be eliminated) according to any one of the embodiments described above as the oscillation circuit provided to the real-time clock device 410 (or the oscillator), or by applying, for example, the real-time clock device 1 according to any one of the embodiments described above as the real-time clock device 410, it is possible to realize the moving object keeping the high reliability for a long period of time.

As such a moving object 400, there can be adopted a variety of types of moving objects, and there can be cited a vehicle (including an electric vehicle), an aircraft such as a jet plane or a helicopter, a ship, a boat, a rocket, an artificial satellite, and so on.

The invention is not limited to the embodiments described above, but can be implemented with a variety of modifications within the scope or the spirit of the invention.

The embodiments and the modified examples described above are illustrative only, and the invention is not limited to the embodiments and the modified examples. For example, it is also possible to arbitrarily combine any of the embodiments and the modified examples described above with each other.

The invention includes configurations (e.g., configurations having the same function, the same way, and the same result, or configurations having the same object and the same advantage) substantially the same as the configuration described as the embodiment of the invention. Further, the invention includes configurations obtained by replacing a non-essential part of the configuration described as the embodiment of the invention. Further, the invention includes configurations providing the same functions and advantages and configurations capable of achieving the same object as the configuration described as the embodiment of the invention. Further, the invention includes configurations obtained by adding known technologies to the configuration described as one of the embodiments of the invention.

The entire disclosure of Japanese Patent Application No. 2015-168792, filed Aug. 28, 2015 is expressly incorporated by reference herein.

What is claimed is:

1. An oscillation circuit comprising:
   an oscillating circuit adapted to oscillate a resonator element;
   a capacitance circuit connected to the oscillating circuit, and configured to correct an oscillation frequency of the oscillating circuit;
   a logic circuit to which a signal output from the oscillating circuit is input, and which is configured to correct a frequency of the signal; and
   a control circuit adapted to control an operation of the capacitance circuit and an operation of the logic circuit, wherein:
   the capacitance circuit is configured to correct a frequency-temperature characteristic of the resonator element, and
   the logic circuit is configured to correct a frequency variation other than the frequency-temperature characteristic of the resonator element.

2. The oscillation circuit according to claim 1, wherein the frequency variation other than the frequency-temperature characteristic of the resonator element is a temporal frequency variation of the resonator element.

3. The oscillation circuit according to claim 1, wherein the logic circuit is further configured to correct the frequency-temperature characteristic of the resonator element, and
   the control circuit controls an operation of the logic circuit correcting the frequency variation other than the frequency-temperature characteristic of the resonator element and an operation of the logic circuit correcting the frequency-temperature characteristic of the resonator element.

4. The oscillation circuit according to claim 2, wherein the logic circuit is further configured to correct the frequency-temperature characteristic of the resonator element, and the control circuit controls an operation of the logic circuit correcting the frequency variation other than the frequency-temperature characteristic of the resonator element and an operation of the logic circuit correcting the frequency-temperature characteristic of the resonator element.

5. The oscillation circuit according to claim 3, wherein the control circuit:

implements first control of the operation of the capacitance circuit correcting the frequency-temperature characteristic of the resonator element when in a predetermined temperature range;

implements second control of the operation of the capacitance circuit correcting the frequency-temperature characteristic of the resonator element when out of the predetermined temperature range;

implements first control of the operation of the logic circuit correcting the frequency-temperature characteristic of the resonator element when in the predetermined temperature range; and implements second control of the operation of the logic circuit correcting the frequency-temperature characteristic of the resonator element when out of the predetermined temperature range.

6. The oscillation circuit according to claim 4, wherein the control circuit:

implements first control of the operation of the capacitance circuit correcting the frequency-temperature characteristic of the resonator element when in a predetermined temperature range;

implements second control of the operation of the capacitance circuit correcting the frequency-temperature characteristic of the resonator element when out of the predetermined temperature range;

implements first control of the operation of the logic circuit correcting the frequency-temperature characteristic of the resonator element when in the predetermined temperature range; and implements second control of the operation of the logic circuit correcting the frequency-temperature characteristic of the resonator element when out of the predetermined temperature range.

7. The oscillation circuit according to claim 1, further comprising:

a storage section storing time information, wherein the control circuit outputs a correction signal based on the time information to the logic circuit.

8. The oscillation circuit according to claim 2, further comprising:

a storage section storing time information, wherein the control circuit outputs a correction signal based on the time information to the logic circuit.

9. The oscillation circuit according to claim 3, further comprising:

a storage section storing time information, wherein the control circuit outputs a correction signal based on the time information to the logic circuit.

10. The oscillation circuit according to claim 1, further comprising:

a storage section storing time information and information for calculating a temporal frequency variation the resonator element has, wherein the control circuit outputs a correction signal based on the time information and the information for calculating the temporal frequency variation to the logic circuit.

11. The oscillation circuit according to claim 2, further comprising:

a storage section storing time information and information for calculating the temporal frequency variation the resonator element has, wherein the control circuit outputs a correction signal based on the time information and the information for calculating the temporal frequency variation to the logic circuit.

12. The oscillation circuit according to claim 3, further comprising:

a storage section storing time information and information for calculating a temporal frequency variation the resonator element has, wherein the control circuit outputs a correction signal based on the time information and the information for calculating the temporal frequency variation to the logic circuit.

13. An electronic apparatus comprising:
the oscillation circuit according to claim 1.

14. A moving object comprising:
the oscillation circuit according to claim 1.

* * * * *